US007956388B2

(12) United States Patent
Masuoka et al.

(10) Patent No.: US 7,956,388 B2
(45) Date of Patent: Jun. 7, 2011

(54) SOLID-STATE IMAGE PICKUP ELEMENT AND SOLID-STATE IMAGE PICKUP DEVICE

(75) Inventors: Fujio Masuoka, Tokyo (JP); Hiroki Nakamura, Tokyo (JP)

(73) Assignee: Unisantis Electronics (Japan) Ltd. (JP)

( * ) Notice: Subject to any disclaimer, the term of this patent is extended or adjusted under 35 U.S.C. 154(b) by 0 days.

(21) Appl. No.: 12/603,001

(22) Filed: Oct. 21, 2009

(65) Prior Publication Data

US 2010/0102362 A1 Apr. 29, 2010

Related U.S. Application Data

(60) Provisional application No. 61/207,713, filed on Feb. 13, 2009.

(30) Foreign Application Priority Data

Oct. 24, 2008 (JP) .................... PCT/JP2008/069321

(51) Int. Cl.
*H01L 27/148* (2006.01)
(52) U.S. Cl. ........ 257/225; 257/232; 257/233; 257/240; 257/243; 257/248; 257/E21.158; 257/E27.15
(58) Field of Classification Search .................. 257/225, 257/232, 233, 240, 243, 248, E21.158, E27.15
See application file for complete search history.

(56) References Cited

U.S. PATENT DOCUMENTS

| 5,029,321 | A | * | 7/1991 | Kimura | 257/243 |
| 6,087,685 | A | * | 7/2000 | Harada | 257/232 |
| 7,364,960 | B2 | * | 4/2008 | Lyu | 438/204 |
| 2009/0283804 | A1 | * | 11/2009 | Masuoka et al. | 257/225 |

FOREIGN PATENT DOCUMENTS

| JP | 59-129463 A | 7/1984 |
| JP | 01-168059 A | 7/1989 |
| JP | 02-278874 A | 11/1990 |
| JP | 02-304976 A | 12/1990 |
| JP | 03-161970 A | 7/1991 |
| JP | 03-285335 A | 12/1991 |
| JP | 06-097416 A | 4/1994 |
| JP | 06-252375 A | 9/1994 |
| JP | 06-268189 A | 9/1994 |
| JP | 10-107249 A | 4/1998 |
| JP | 2001-308309 A | 11/2001 |

OTHER PUBLICATIONS

International Search Report for International Application No. PCT/JP2008/069321, dated Nov. 25, 2008, 7 pages. Written Opinion of the International Searching Authority for International Application No. PCT/JP2008/069321, dated Nov. 25, 2008, 9 pages.

* cited by examiner

*Primary Examiner* — Andy Huynh
(74) *Attorney, Agent, or Firm* — Brinks Hofer Gilson & Lione

(57) ABSTRACT

It is intended to provide a solid-state image pickup element capable of reducing an area of a read channel to increase a light-receiving area. The solid-state image pickup element comprises a p-type planar semiconductor, a hole formed in the p-type planar semiconductor, a p+-type region formed in a bottom of the hole, a p+-type isolation region formed in a part of a sidewall of the hole and connected to the p+-type region, an n-type photoelectric conversion region formed beneath the p+-type region, a transfer electrode formed on the entire sidewall of the hole through a gate dielectric film, a CCD channel region formed in a top of the p-type planar semiconductor, and a read channel formed in a region of the p-type planar semiconductor between the n-type photoelectric conversion region and the CCD channel region.

3 Claims, 34 Drawing Sheets

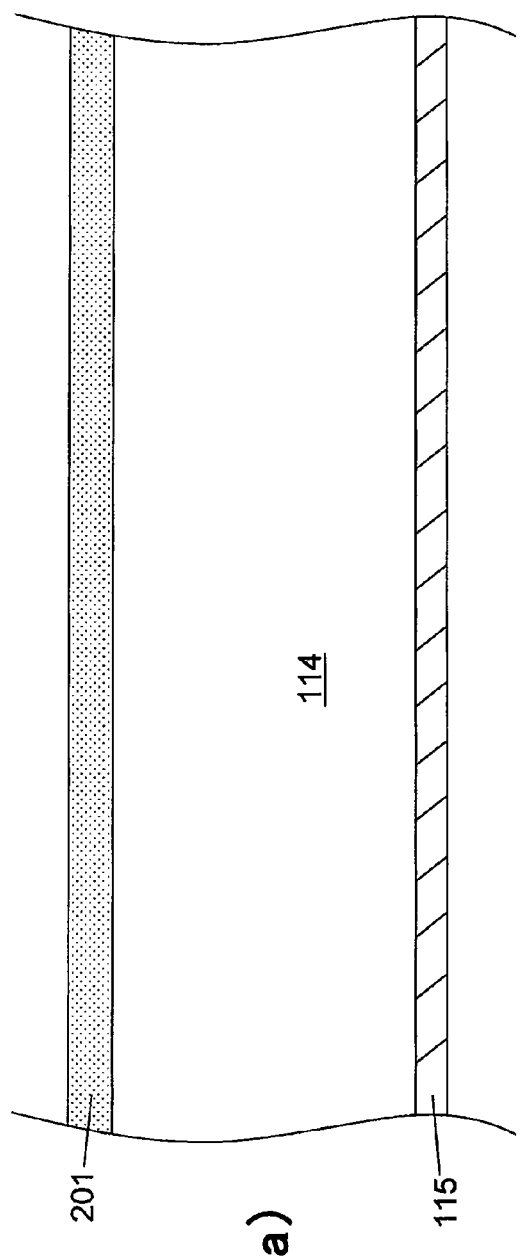
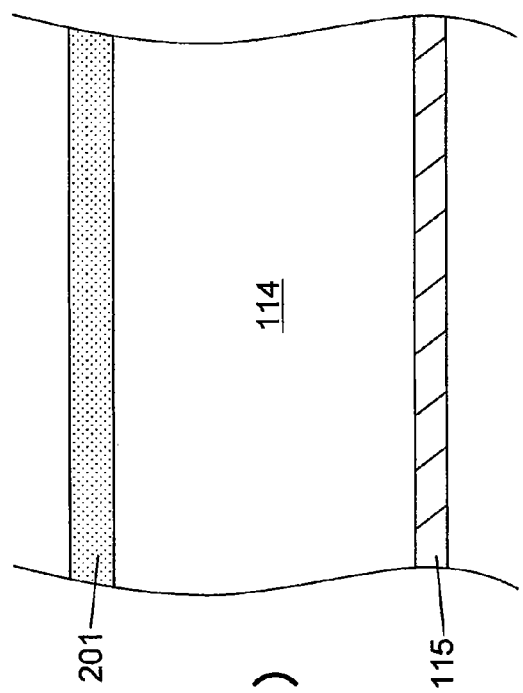
FIG. 6(a)
FIG. 6(b)

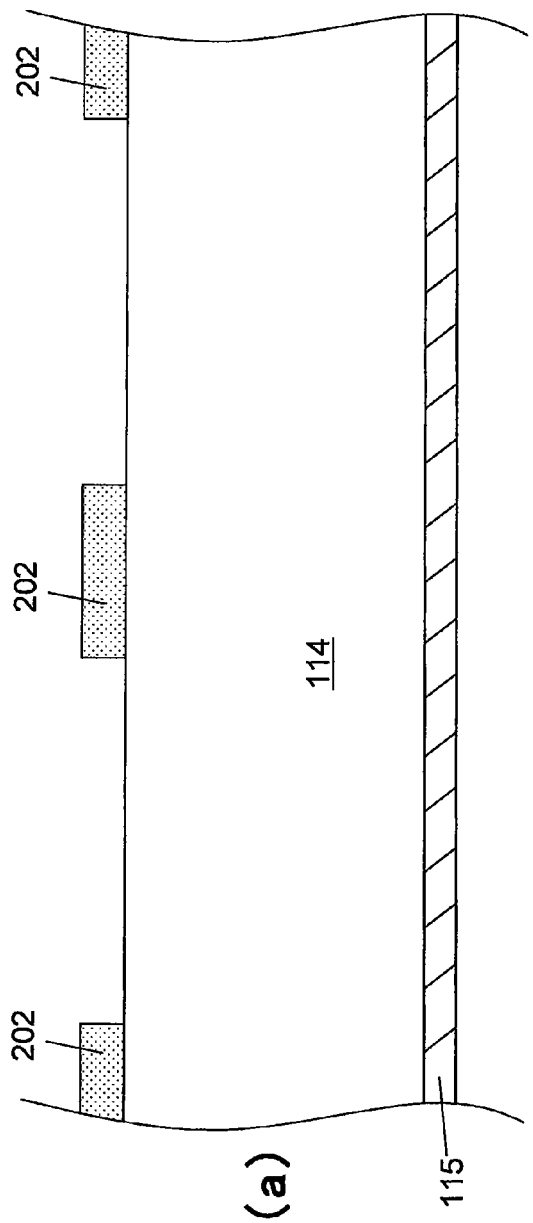
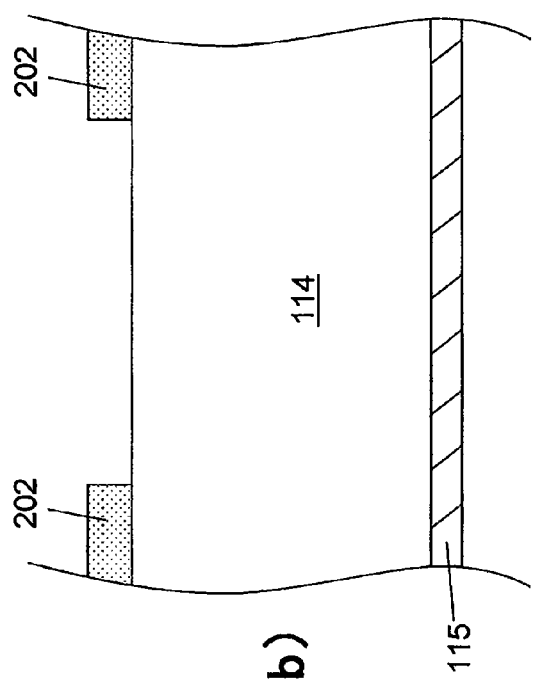

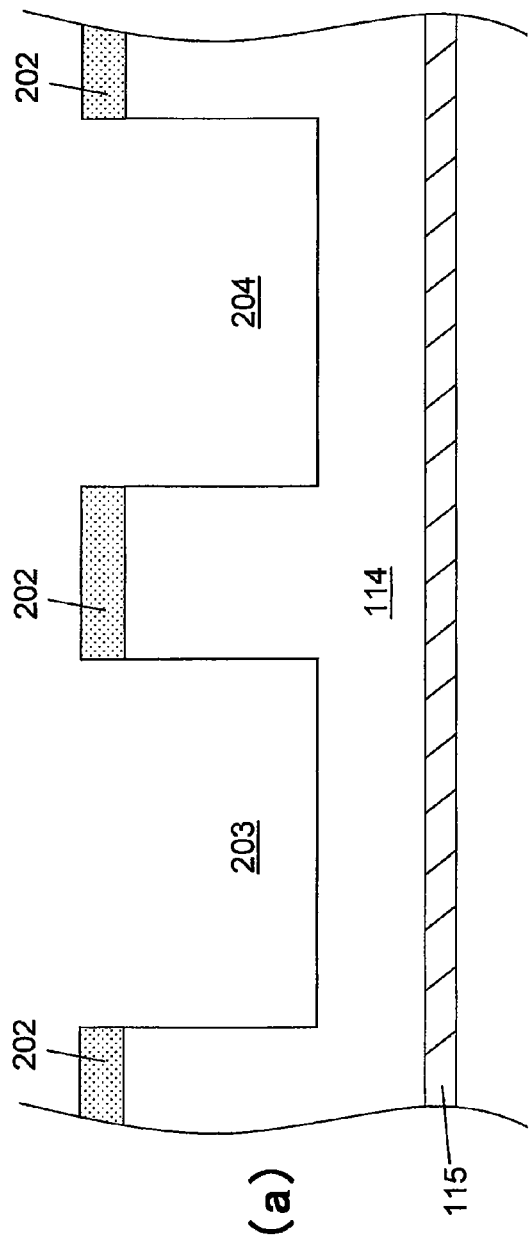
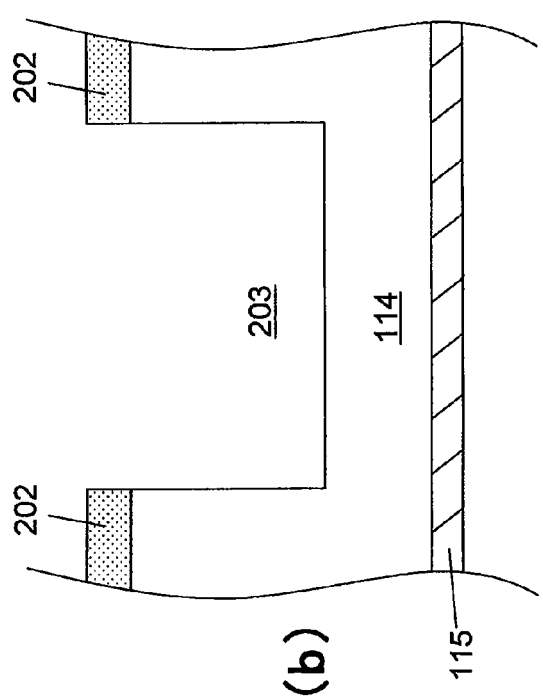
FIG. 8(a)
FIG. 8(b)

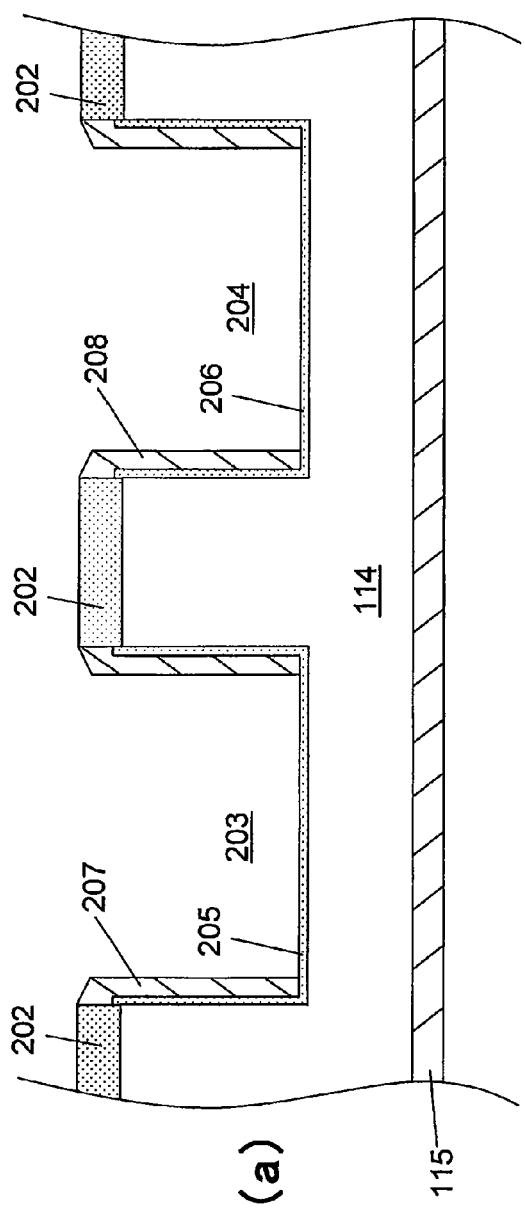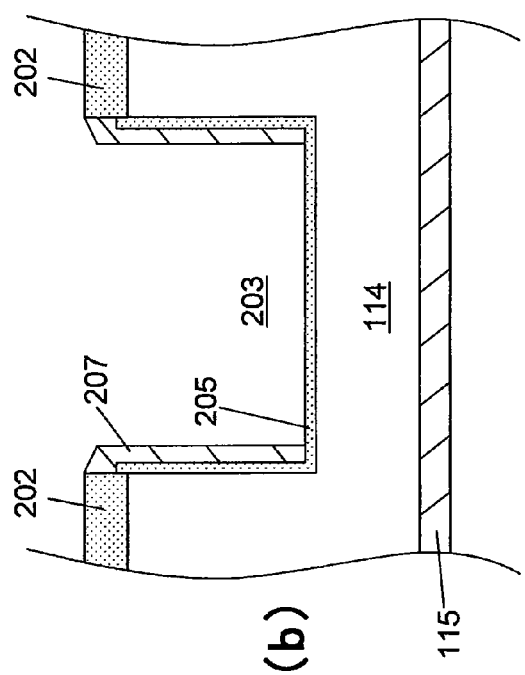
FIG. 9(a)
FIG. 9(b)

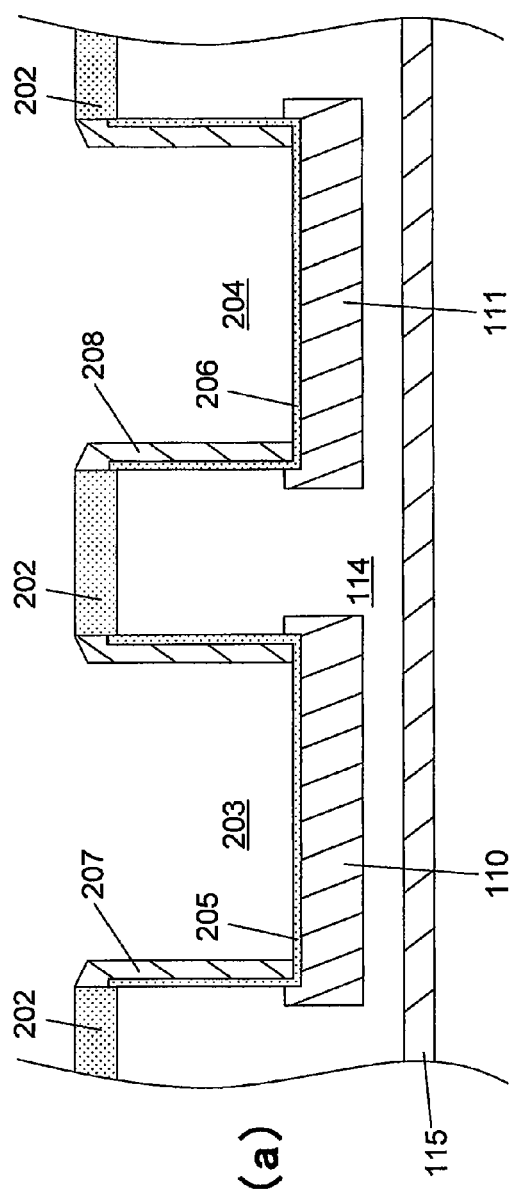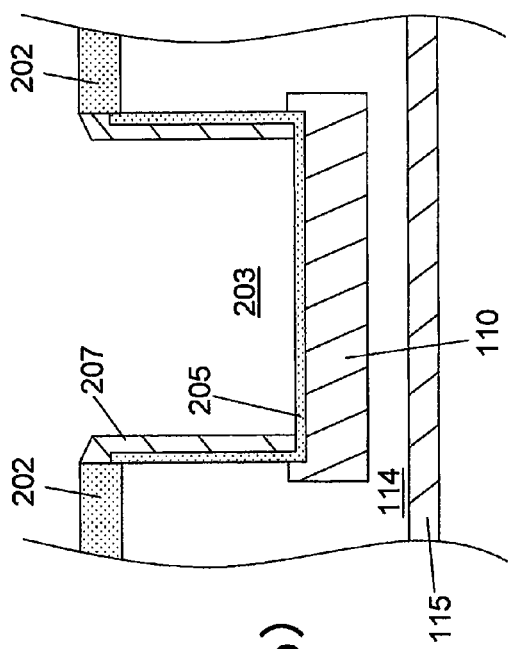
FIG. 10(a)
FIG. 10(b)

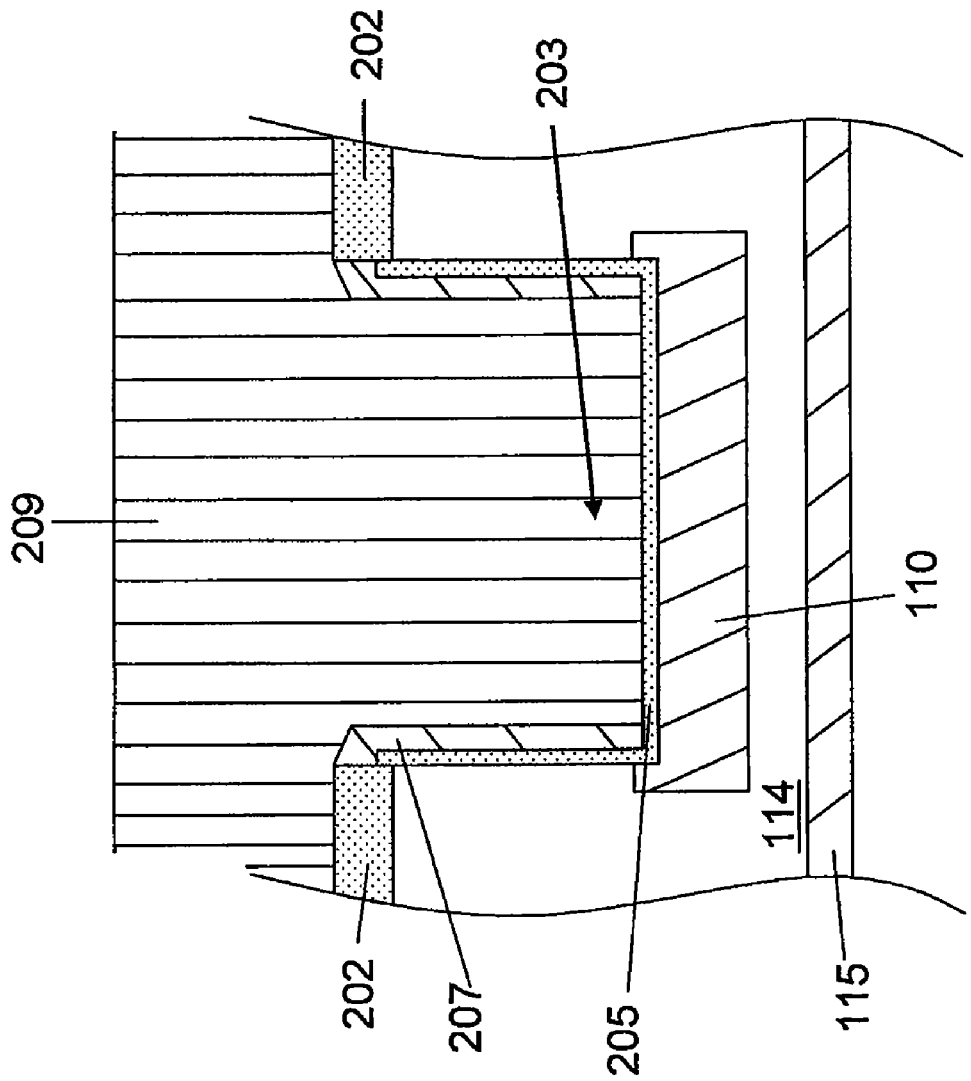

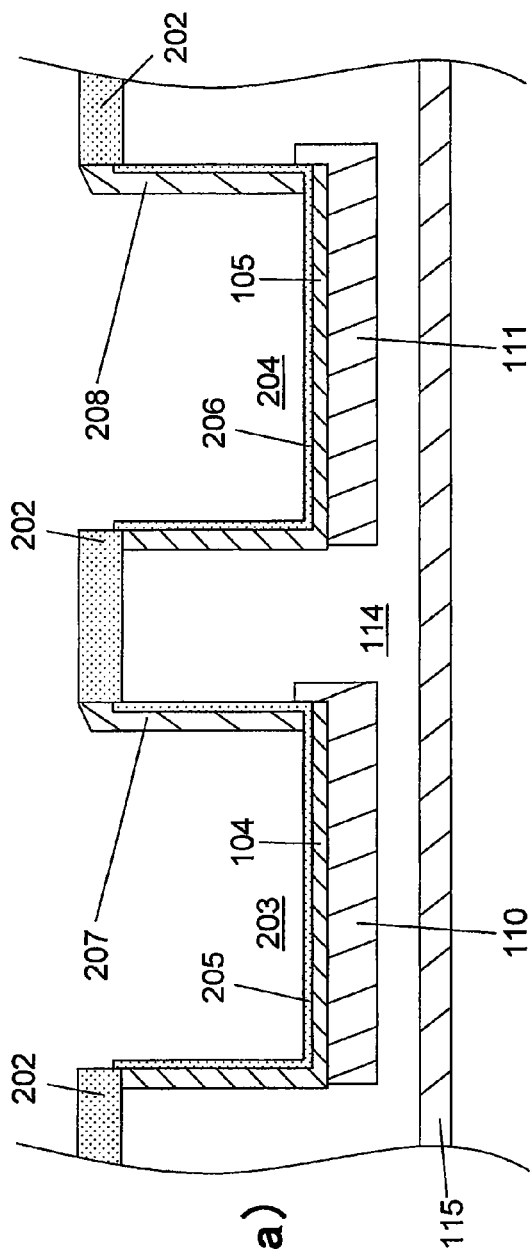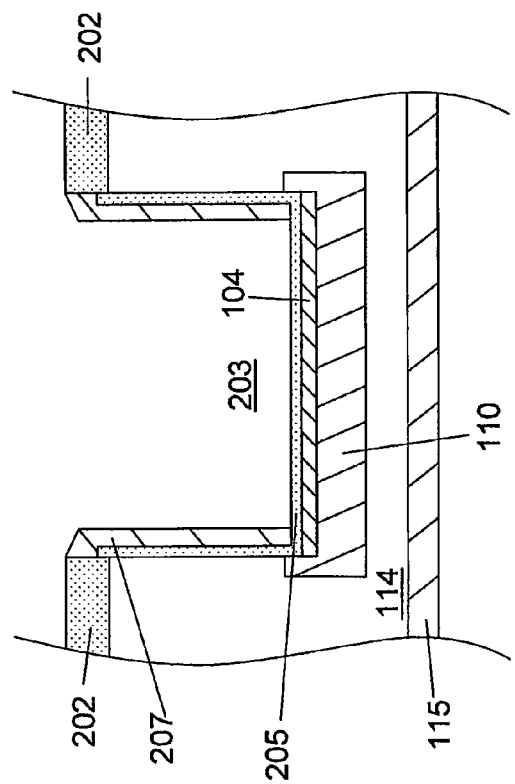
FIG. 12(a)
FIG. 12(b)

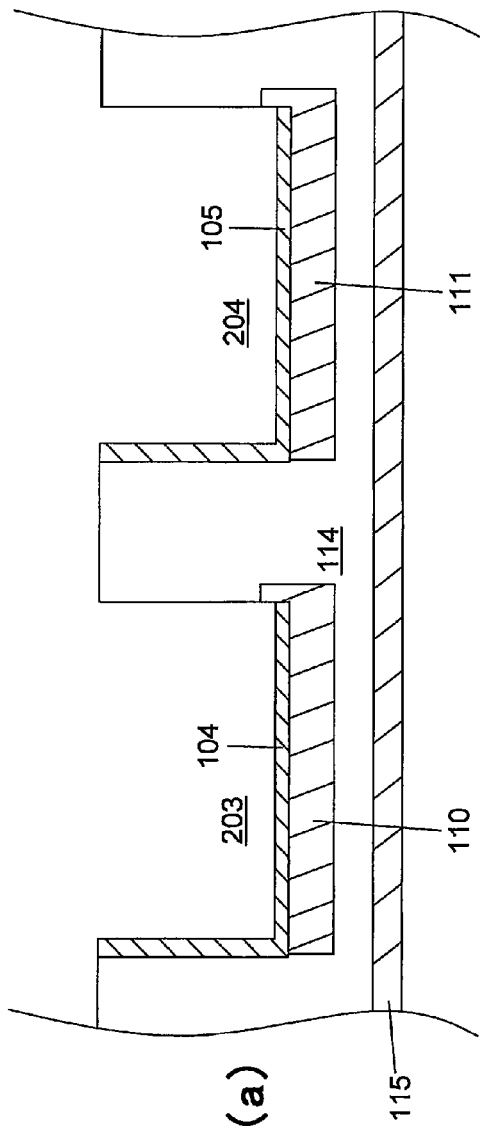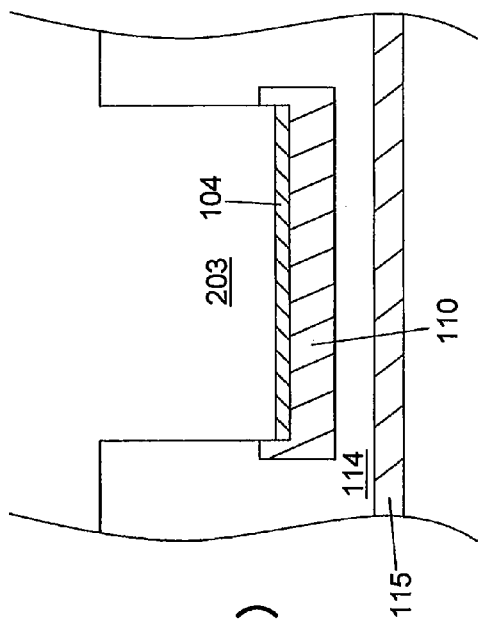
FIG. 13(a)
FIG. 13(b)

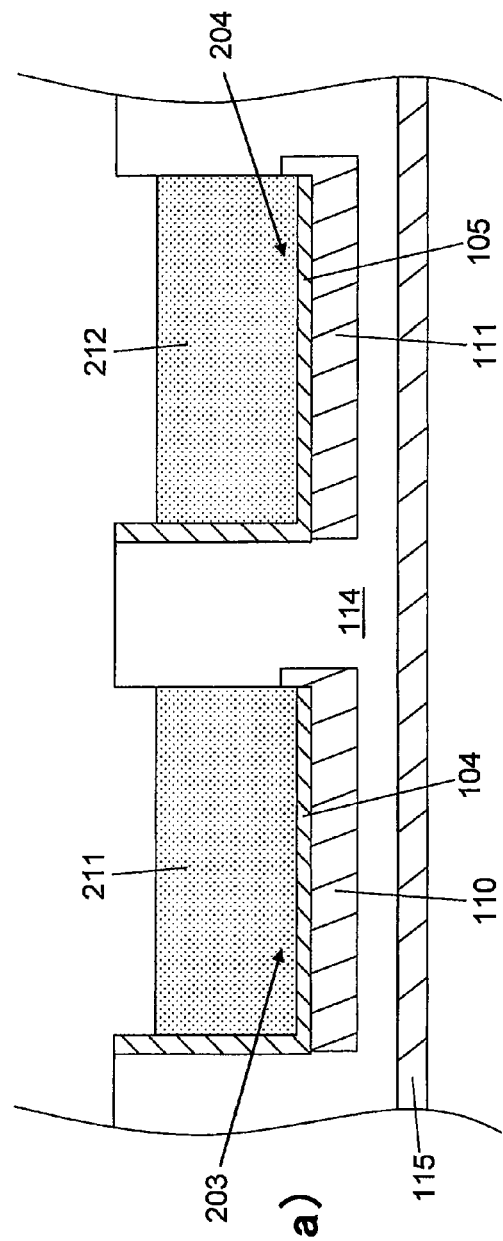
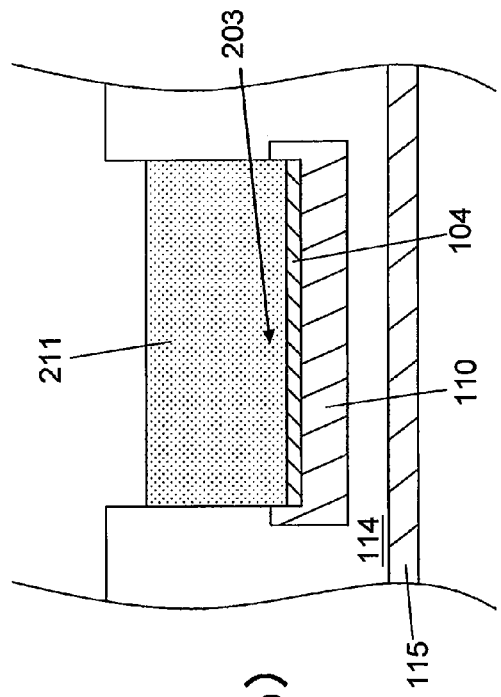
FIG. 14(a)
FIG. 14(b)

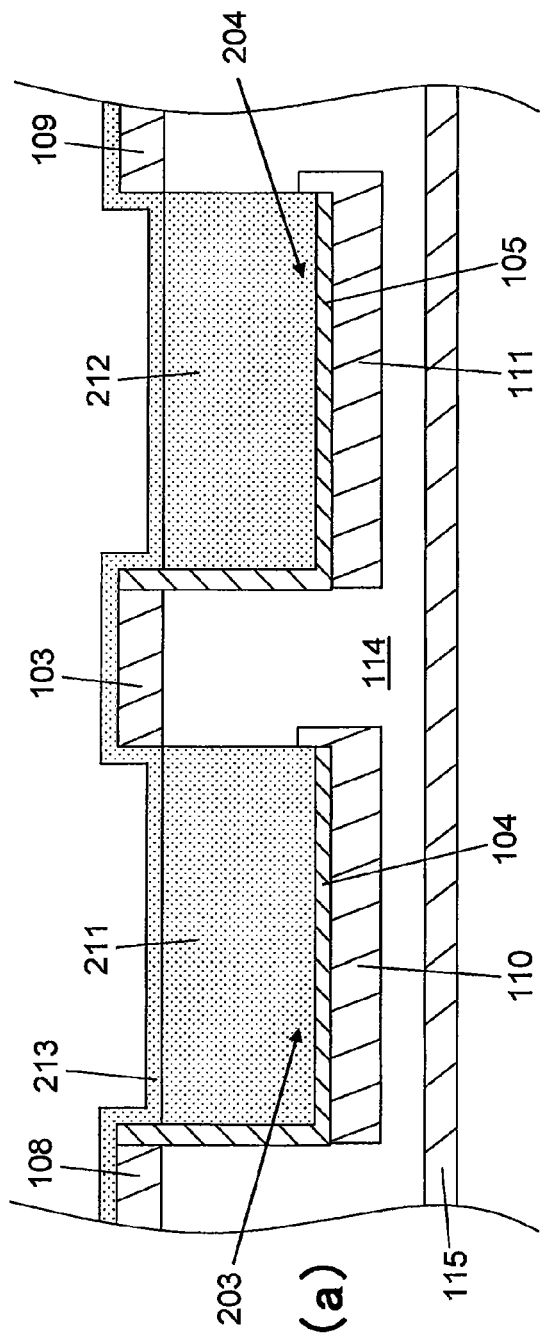
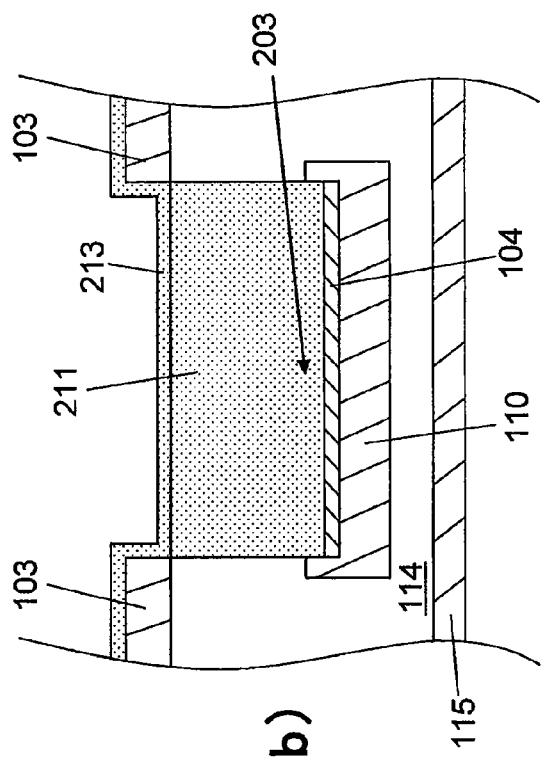
FIG. 16(a)
FIG. 16(b)

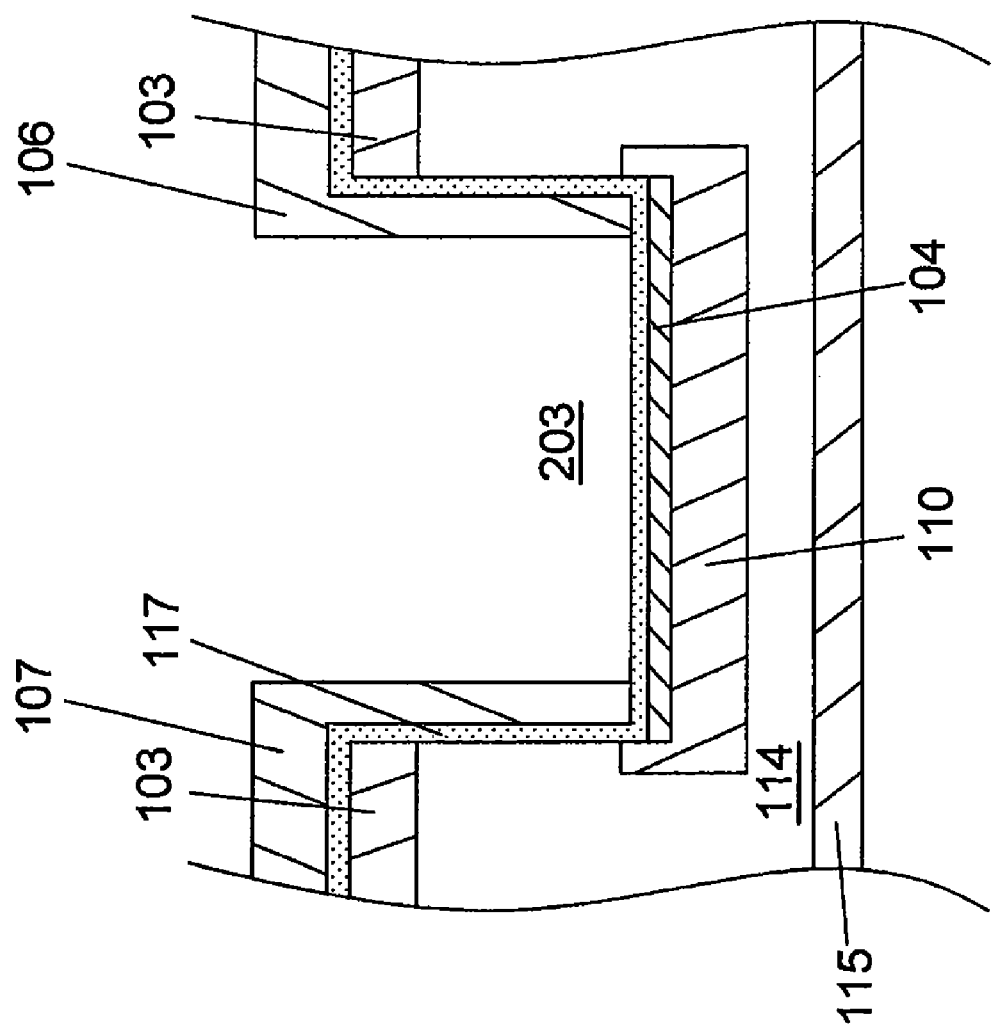

SOLID-STATE IMAGE PICKUP ELEMENT AND SOLID-STATE IMAGE PICKUP DEVICE

RELATED APPLICATIONS

Pursuant to 35 U.S.C. §119(e), this document claims the benefit of the filing date of Provisional U.S. Patent Application Ser. No. 61/207,713 filed on Feb. 13, 2009. This application also claims priority under 35 U.S.C. §365(a) to PCT/JP2008/069321 filed on Oct. 24, 2008. The entire contents of which are hereby incorporated by reference.

BACKGROUND OF THE INVENTION

1. Technical Field

The present invention relates to a solid-state image pickup element, a solid-state image pickup device and a production method therefor, and more particularly to a CCD solid-state image pickup element, a CCD solid-state image pickup device and a production method therefor 2. Background Art In a conventional solid-state image pickup device (solid-state image sensor) for use in a video camera and others, a plurality of photodetection elements are arranged in a matrix array, and a vertical charge-coupled device (VCCD) is provided between adjacent columns of the photodetection elements to read signal charges generated in an associated one of the adjacent columns of photodetection elements.

A structure of the conventional solid-state image pickup device will be described below (see, for example, the following Patent Document 1). FIG. 1 is a sectional view showing a unit pixel of the conventional solid-state image pickup device. A photodiode (PD) in each unit pixel is comprised of an n-type photoelectric conversion region 13 formed in a p-type well region 12 formed in an upper region of an n-type semiconductor substrate 11, to serve as a charge storage layer, and a p+-type region 14 formed on the n-type photoelectric conversion region 13.

An n-type CCD channel region 16 is also formed in the p-type well region 12 in the form of an n-type impurity-doped region. A portion of the p-type well region 12 between the n-type CCD channel region 16 and the photodiode from which signal charges are read out to the n-type CCD channel region 16 is formed as a p-type impurity-doped region to provide a read channel. Thus, signal charges generated in the photodiode are temporarily stored in the n-type photoelectric conversion region 13, and then read out to the n-type CCD channel region 16 via the read channel.

Further, a p+-type element isolation region 15 is provided between the n-type CCD channel region 16 and another adjacent photodiode. Based on the p+-type element isolation region 15, the n-type CCD channel region 16 is electrically isolated from the adjacent photodiode, and the n-type CCD channel region 16 are isolated from another adjacent n-type CCD channel region.

A transfer electrode 18 is formed on a surface of the semiconductor substrate through a Si oxide film 17 to extend in a horizontal direction and pass through between the photodiode and the adjacent photodiode. Thus, in the solid-state image pickup device, when a read signal is applied to a selected one of the transfer electrodes 18, the read channel located just below the selected transfer electrode 18 is effected to allow signal charges generated in the photodiode associated with the read channel to be read out to the corresponding n-type CCD channel region 16 therethrough.

A metal shield film 20 is formed on the surface of the semiconductor substrate having the transfer electrodes 18. The metal shielding film 20 has a plurality of metal-shield-film openings 24 each provided as a light transmission portion on a photodiode-by-photodiode basis to transmit therethrough light to be received by the p+-type region 14 serving as a light-receiving section.

[Patent Document 1] JP 2000-101056A

As above, in the conventional solid-state image pickup element, the photodiode (PD), the read channel, the n-type CCD channel region and the p+-type element isolation region are formed in one plane, and thereby there is a limit to an increase in ratio of a surface area of a light-receiving section (photodiode) to the overall surface area of one pixel. It is therefore an object of the present invention to provide a solid-state image pickup element capable of reducing an area of a read channel to increase a ratio of a surface area of a light-receiving section (photodiode) to the overall surface area of one pixel.

SUMMARY OF THE INVENTION

In order to achieve the above object, according to a first object of the present invention, there is provided a solid-state image pickup element which comprises: a second-conductive type planar semiconductor layer; a first-conductive type planar semiconductor layer formed on the second-conductive type planar semiconductor layer; a hole portion formed in the first-conductive type planar semiconductor layer to define a hole therein; a first-conductive type high-concentration impurity region formed in a bottom wall of the hole portion of the first-conductive type planar semiconductor layer; a first-conductive type high-concentration impurity-doped element isolation region formed in a part of a sidewall of the hole portion of the first-conductive type planar semiconductor layer, and connected to the first-conductive type high-concentration impurity region; a second-conductive type photoelectric conversion region formed in a portion of the first-conductive type planar semiconductor layer located beneath the first-conductive type high-concentration impurity region and in a part of a lower region of the remaining part of the sidewall of the hole portion of the first-conductive type planar semiconductor layer, and adapted to undergo a change in charge amount upon receiving light; a transfer electrode formed on the sidewall of the hole portion of the first-conductive type planar semiconductor layer through a gate dielectric film; a second-conductive type CCD channel region formed in a top surface of the first-conductive type planar semiconductor layer and in a part of an upper region of the remaining part of the sidewall of the hole portion of the first-conductive type planar semiconductor layer; and a read channel formed in a region of the first-conductive type planar semiconductor layer sandwiched between the second-conductive type photoelectric conversion region and the second-conductive type CCD channel region.

According a second aspect of the present invention, there is provided a solid-state image pickup device which comprises a plurality of the above solid-state image pickup elements, wherein the solid-state image pickup elements are arranged in a matrix array.

Preferably, the solid-state image pickup device according to the second aspect of the present invention includes: a plurality of the second-conductive type CCD channel regions made up of a plurality of second-conductive type impurity regions each extending in a column direction at least in a region between adjacent ones of a plurality of columns of the hole portions formed in the first-conductive type planar semiconductor layer; and a plurality of the first-conductive type high-concentration impurity-doped element isolation regions each arranged to prevent contact between adjacent ones of the second-conductive type CCD channel regions.

Preferably, the above solid-state image pickup device includes a plurality of the transfer electrodes each formed to extend in a row direction in a region between adjacent ones of a plurality of rows of the hole portions formed in the first-conductive type planar semiconductor layer, and arranged along and in spaced-apart relation to the associated second-conductive type CCD channel region by a given distance to transfer therethrough signal charges generated in the associated solid-state image pickup element.

According to a third aspect of the present invention, there is provided a solid-state image pickup device which comprises a plurality of element line groups each consisting of a first solid-state image pickup element line and a second solid-state image pickup element line, wherein the first solid-state image pickup element line consists of a plurality of the above solid-state image pickup elements which are arranged in a first direction at intervals of a first distance, and the second solid-state image pickup element line consists of a plurality of the above solid-state image pickup elements which are arranged in the first direction at intervals of the first distance and in displaced relation to the first solid-state image pickup element line in the first direction by a given distance, and wherein the first and second solid-state image pickup element lines in each of the element line groups are arranged in a second direction perpendicular to the first direction at intervals of a second distance, and the element line groups are arranged in the second direction at interval of the second distance and in displaced relation to each other in the first direction.

Preferably, the solid-state image pickup device according to the third aspect of the present invention includes: a plurality of the second-conductive type CCD channel regions made up of a plurality of second-conductive type impurity regions each extending in a column direction at least in a region between adjacent ones of a plurality of columns of the hole portions formed in the first-conductive type planar semiconductor layer, while passing through the respective hole portions in the adjacent columns; and a plurality of the first-conductive type high-concentration impurity-doped element isolation regions arranged to prevent contact between adjacent ones of the second-conductive type CCD channel regions.

Preferably, the above solid-state image pickup device includes a plurality of the transfer electrodes each formed to extend in a row direction in a region between adjacent ones of a plurality of rows of the hole portions formed in the first-conductive type planar semiconductor layer, while passing through the respective hole portions in the adjacent rows, wherein the transfer electrodes are arranged in spaced-apart relation to each other by a given distance to allow signal charges generated in each of the solid-state image pickup elements, to be transferred along an associated one of the second-conductive type CCD channel regions.

According to a fourth aspect of the present invention, there is provided a method of producing a solid-state image pickup element, comprising the steps of: forming a hole portion defining a hole therein, in a first-conductive type planar semiconductor layer formed on a second-conductive type planar semiconductor layer; forming a first-conductive type high-concentration impurity region in a bottom wall of the hole portion of the first-conductive type planar semiconductor layer; forming a first-conductive type high-concentration impurity-doped element isolation region in a part of a sidewall of the hole portion of the first-conductive type planar semiconductor layer; forming a second-conductive type photoelectric conversion region adapted to undergo a change in charge amount upon receiving light, in a portion of the first-conductive type planar semiconductor layer located beneath the first-conductive type high-concentration impurity region and in a part of a lower region of the remaining part of the sidewall of the hole portion of the first-conductive type planar semiconductor layer; forming a transfer electrode on the sidewall of the hole portion of the first-conductive type planar semiconductor layer through a gate dielectric film; forming a second-conductive type CCD channel region in an top surface of the first-conductive type planar semiconductor layer and in a part of an upper region of the remaining part of the sidewall of the hole portion of the first-conductive type planar semiconductor layer; and forming a read channel in a region of the first-conductive type planar semiconductor layer sandwiched between the second-conductive type photoelectric conversion region and the second-conductive type CCD channel region.

Preferably, in the method of the present invention, the step of forming a hole portion includes forming a mask on the first-conductive type planar semiconductor layer formed on the second-conductive type planar semiconductor layer, and etching the first-conductive type planar semiconductor layer to form the hole portion therein.

Preferably, in the above method, the step of forming a second-conductive type photoelectric conversion region includes the sub-steps of: forming a masking material on the sidewall of the hole portion of the first-conductive type planar semiconductor layer; and forming the second-conductive type photoelectric conversion region by an ion-implantation process.

Preferably, in the above method, the step of forming a first-conductive type high-concentration impurity region is performed after the sub-step of forming the second-conductive type photoelectric conversion region by an ion-implantation process.

Preferably, the above method further comprises the step of, after the sub-step of forming the second-conductive type photoelectric conversion region by an ion-implantation process, removing a part of the masking material formed on the sidewall of the hole portion of the first-conductive type planar semiconductor layer, wherein each of the step of forming a first-conductive type high-concentration impurity region and the step of forming a first-conductive type high-concentration impurity-doped element isolation region is performed by an ion-implantation process after the step of removing a part of the masking material.

Preferably, in the method of the present invention, the step of forming a second-conductive type CCD channel region includes the sub-steps of: forming a masking material on the hole portion of the first-conductive type planar semiconductor layer; and forming the second-conductive type CCD channel region by an ion-implantation process.

Preferably, in the above method, the step of forming a first-conductive type high-concentration impurity-doped element isolation region includes the sub-steps of: forming a masking material in such a manner as to allow the first-conductive type high-concentration impurity-doped element isolation region to be formed in connected relation to the first-conductive type high-concentration impurity-doped element isolation region (first-conductive type high-concentration impurity region) by an ion-implantation process; and forming the first-conductive type high-concentration impurity-doped element isolation region by the ion-implantation process.

Preferably, in the method of the present invention, the step of forming a transfer electrode including the sub-steps of:

forming the gate dielectric film on a surface of the first-conductive type planar semiconductor layer; depositing a gate electrode material on the gate dielectric film; flattening the gate electrode material; and etching the flattened gate electrode material to form the transfer electrode.

In the conventional CCD solid-state image pickup element, the photodiode (PD), the read channel, the n-type CCD channel region and the p+-type element isolation region are formed in one plane, and thereby there is a limit to an increase in ratio of a surface area of a light-receiving section (photodiode) to the overall surface area of one pixel, as mentioned above. In the present invention, a read channel can be arranged in a non-horizontal direction to provide a solid-state image pickup element capable of drastically reducing an occupancy area of the read channel to increase a ratio of a surface area of a light-receiving section (photodiode) to the overall surface area of one pixel.

BRIEF DESCRIPTION OF THE DRAWINGS

FIG. 6(a) is a sectional view ($X_1$-$X'_1$ section) showing a step of one example of a production process for the CCD solid-state image pickup element according to the embodiment.

FIG. 6(b) is a sectional view ($Y_1$-$Y'_1$ section) showing the step in FIG. 6(a), in the example of the production process for the CCD solid-state image pickup element according to the embodiment.

FIG. 7(a) is a sectional view ($X_1$-$X'_1$ section) showing a step of the example of the production process for the CCD solid-state image pickup element according to the embodiment.

FIG. 7(b) is a sectional view ($Y_1$-$Y'_1$ section) showing the step in FIG. 7(a), in the example of the production process for the CCD solid-state image pickup element according to the embodiment.

FIG. 8(a) is a sectional view ($X_1$-$X'_1$ section) showing a step of the example of the production process for the CCD solid-state image pickup element according to the embodiment.

FIG. 8(b) is a sectional view ($Y_1$-$Y'_1$ section) showing the step in FIG. 8(a), in the example of the production process for the CCD solid-state image pickup element according to the embodiment.

FIG. 9(a) is a sectional view ($X_1$-$X'_1$ section) showing a step of the example of the production process for the CCD solid-state image pickup element according to the embodiment.

FIG. 9(b) is a sectional view ($Y_1$-$Y'_1$ section) showing the step in FIG. 9(a), in the example of the production process for the CCD solid-state image pickup element according to the embodiment.

FIG. 10(a) is a sectional view ($X_1$-$X'_1$ section) showing a step of the example of the production process for the CCD solid-state image pickup element according to the embodiment.

FIG. 10(b) is a sectional view ($Y_1$-$Y'_1$ section) showing the step in FIG. 10(a), in the example of the production process for the CCD solid-state image pickup element according to the embodiment.

FIG. 11(b) is a sectional view ($Y_1$-$Y'_1$ section) showing the step in FIG. 11(a), in the example of the production process for the CCD solid-state image pickup element according to the embodiment.

FIG. 12(a) is a sectional view ($X_1$-$X'_1$ section) showing a step of the example of the production process for the CCD solid-state image pickup element according to the embodiment.

FIG. 12(b) is a sectional view ($Y_1$-$Y'_1$ section) showing the step in FIG. 12(a), in the example of the production process for the CCD solid-state image pickup element according to the embodiment.

FIG. 13(a) is a sectional view ($X_1$-$X'_1$ section) showing a step of the example of the production process for the CCD solid-state image pickup element according to the embodiment.

FIG. 13(b) is a sectional view ($Y_1$-$Y'_1$ section) showing the step in FIG. 13(a), in the example of the production process for the CCD solid-state image pickup element according to the embodiment.

FIG. 14(a) is a sectional view ($X_1$-$X'_1$ section) showing a step of the example of the production process for the CCD solid-state image pickup element according to the embodiment.

FIG. 14(b) is a sectional view ($Y_1$-$Y'_1$ section) showing the step in FIG. 14(a), in the example of the production process for the CCD solid-state image pickup element according to the embodiment.

FIG. 16(a) is a sectional view ($X_1$-$X'_1$ section) showing a step of the example of the production process for the CCD solid-state image pickup element according to the embodiment.

FIG. 16(b) is a sectional view ($Y_1$-$Y'_1$ section) showing the step in FIG. 16(a), in the example of the production process for the CCD solid-state image pickup element according to the embodiment.

FIG. 20(b) is a sectional view ($Y_1$-$Y'_1$ section) showing the step in FIG. 20(a), in the example of the production process for the CCD solid-state image pickup element according to the embodiment.

With reference to the accompanying drawings, the present invention will now be specifically described based on an embodiment thereof.

DETAILED DESCRIPTION OF THE PREFERRED EMBODIMENTS

First Embodiment

Figure 1:
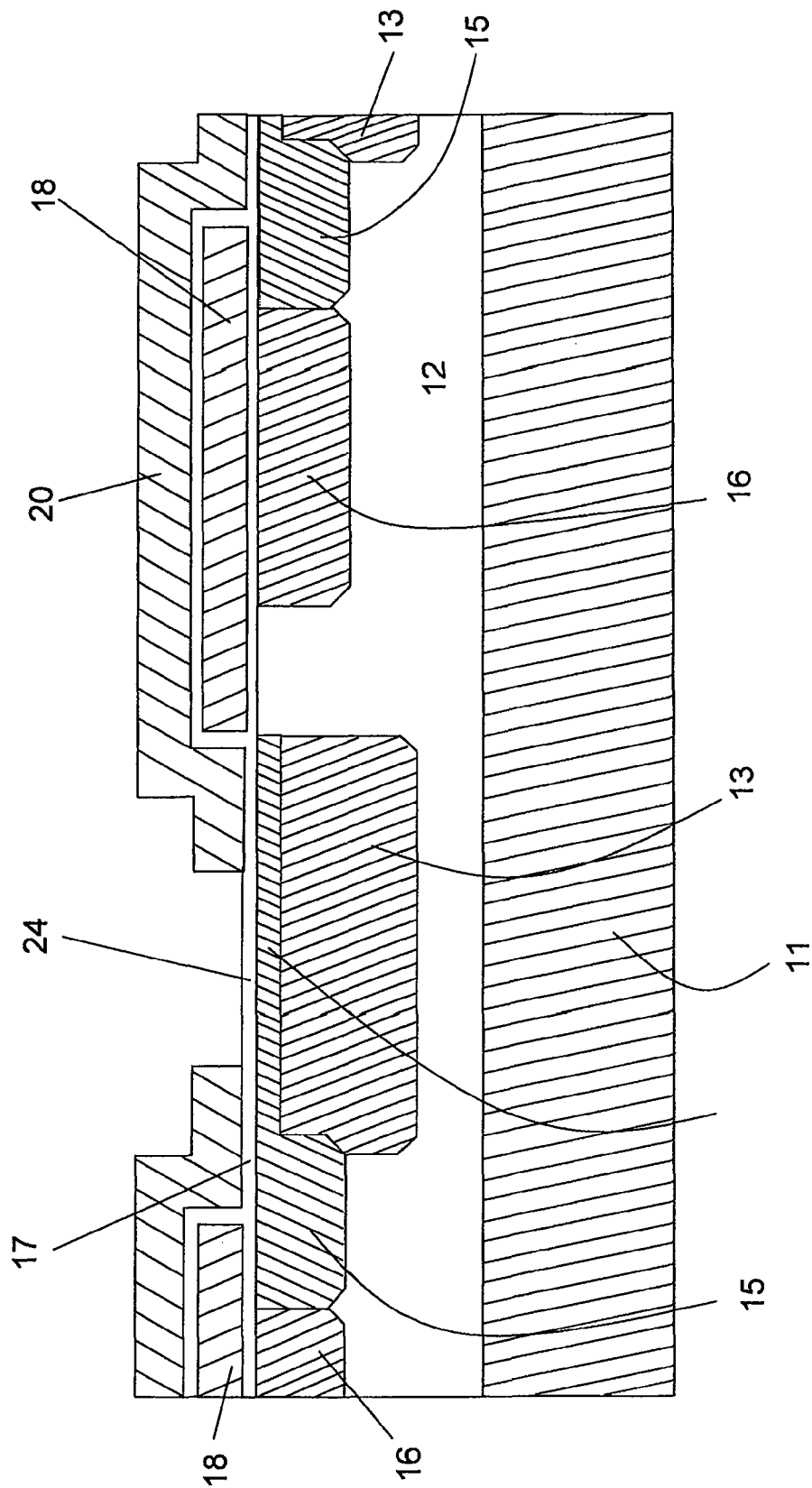
FIG. 1 is a sectional view showing a unit pixel of a conventional solid-state image pickup element.
Figure 2:
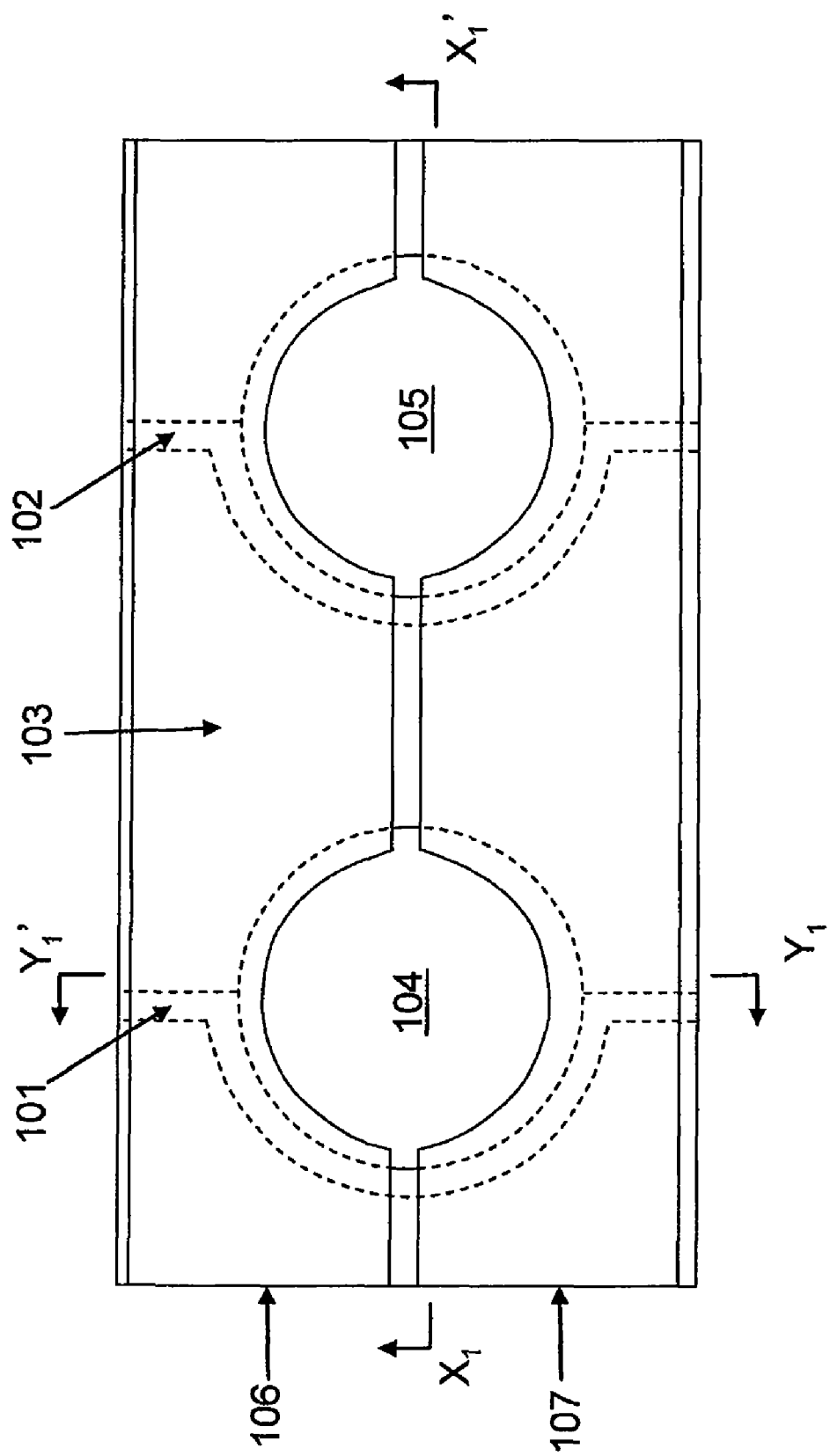
FIG. 2 is a top plan view of a CCD solid-state image pickup element according to one embodiment of the present invention.
Figure 3:
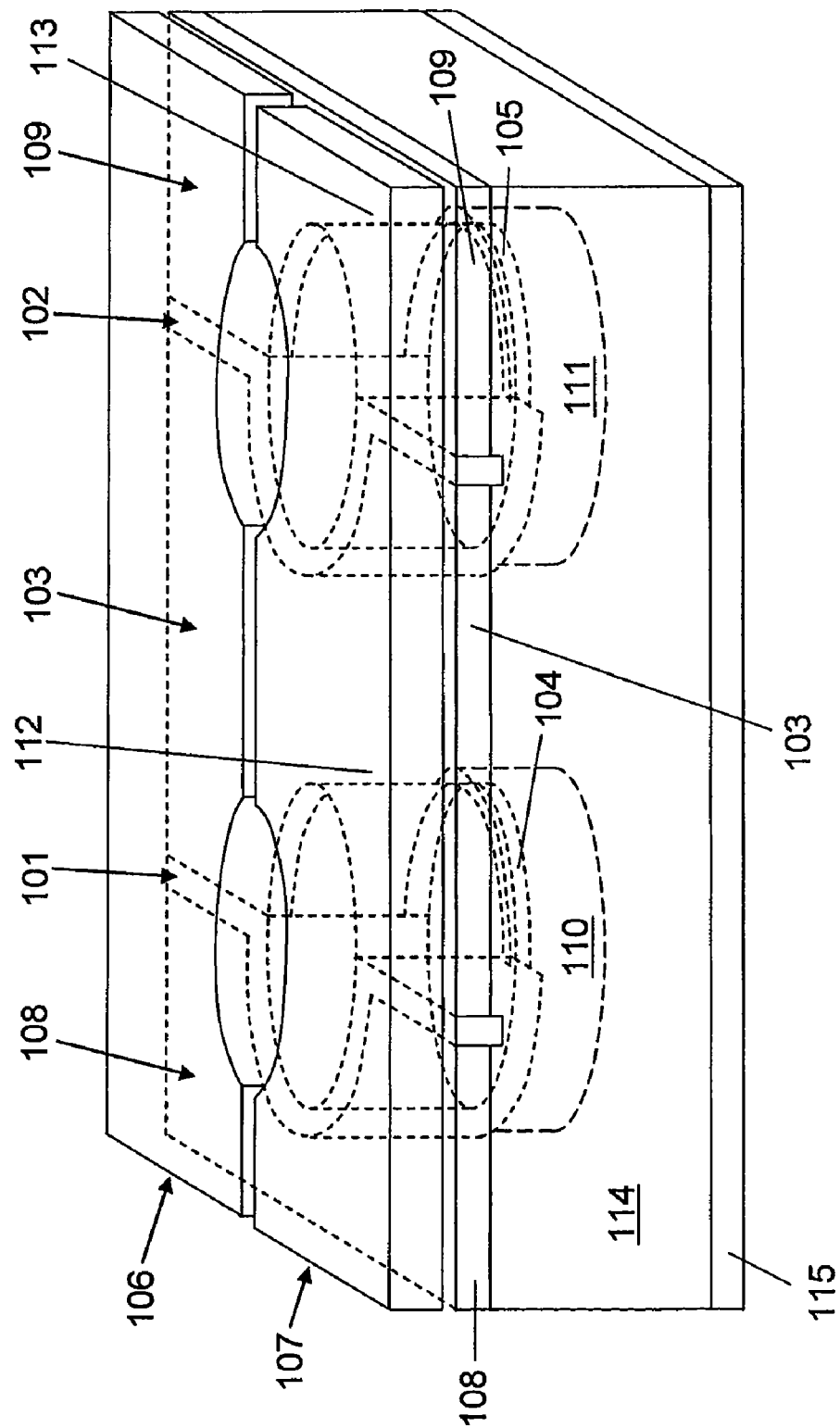
FIG. 3 is a bird's-eye view of the CCD solid-state image pickup element according to the embodiment.
Figure 4:
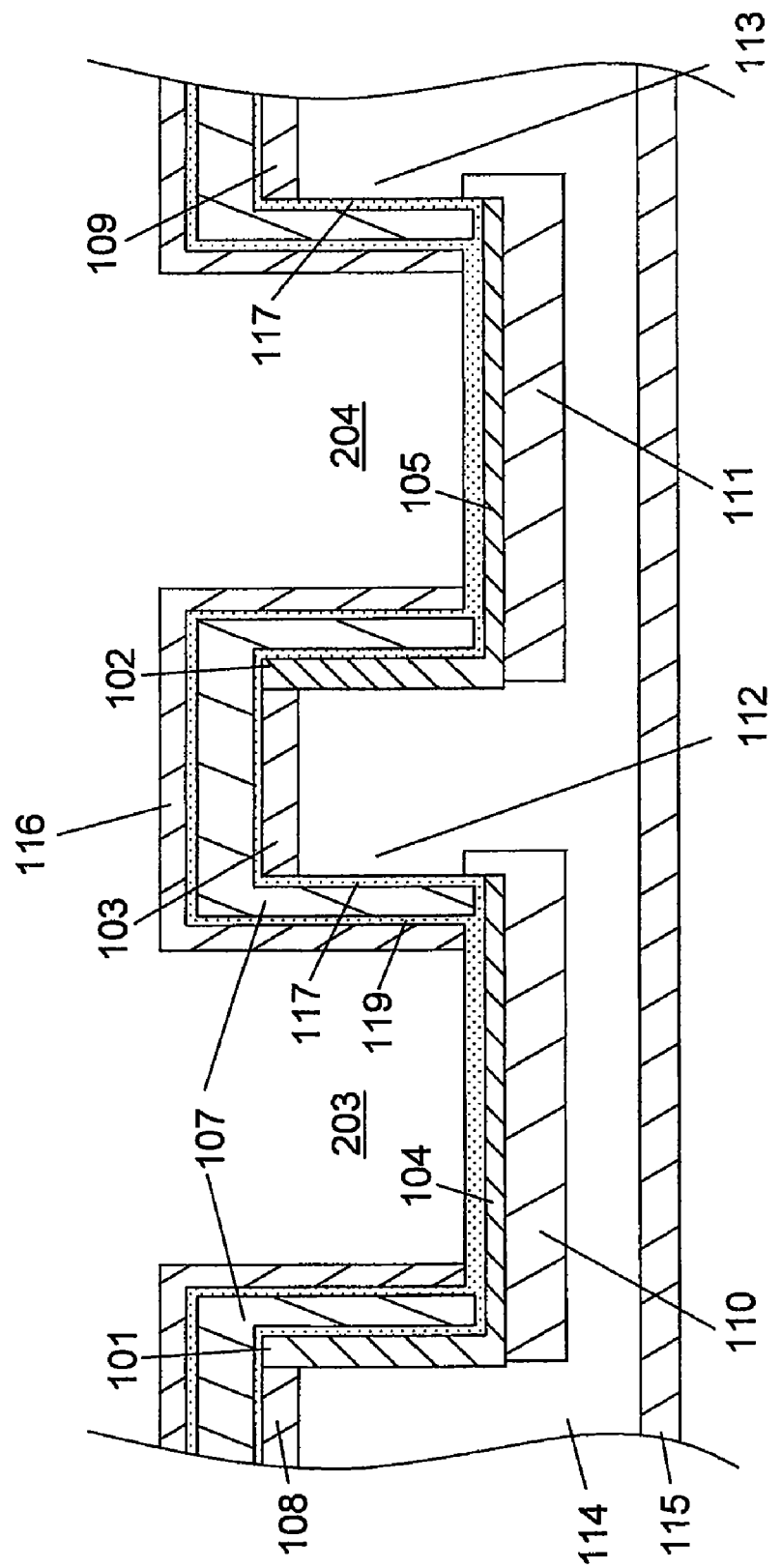
FIG. 4 is a sectional view taken along the line $X_1$-$X'_1$ in FIG. 2.
Figure 5:
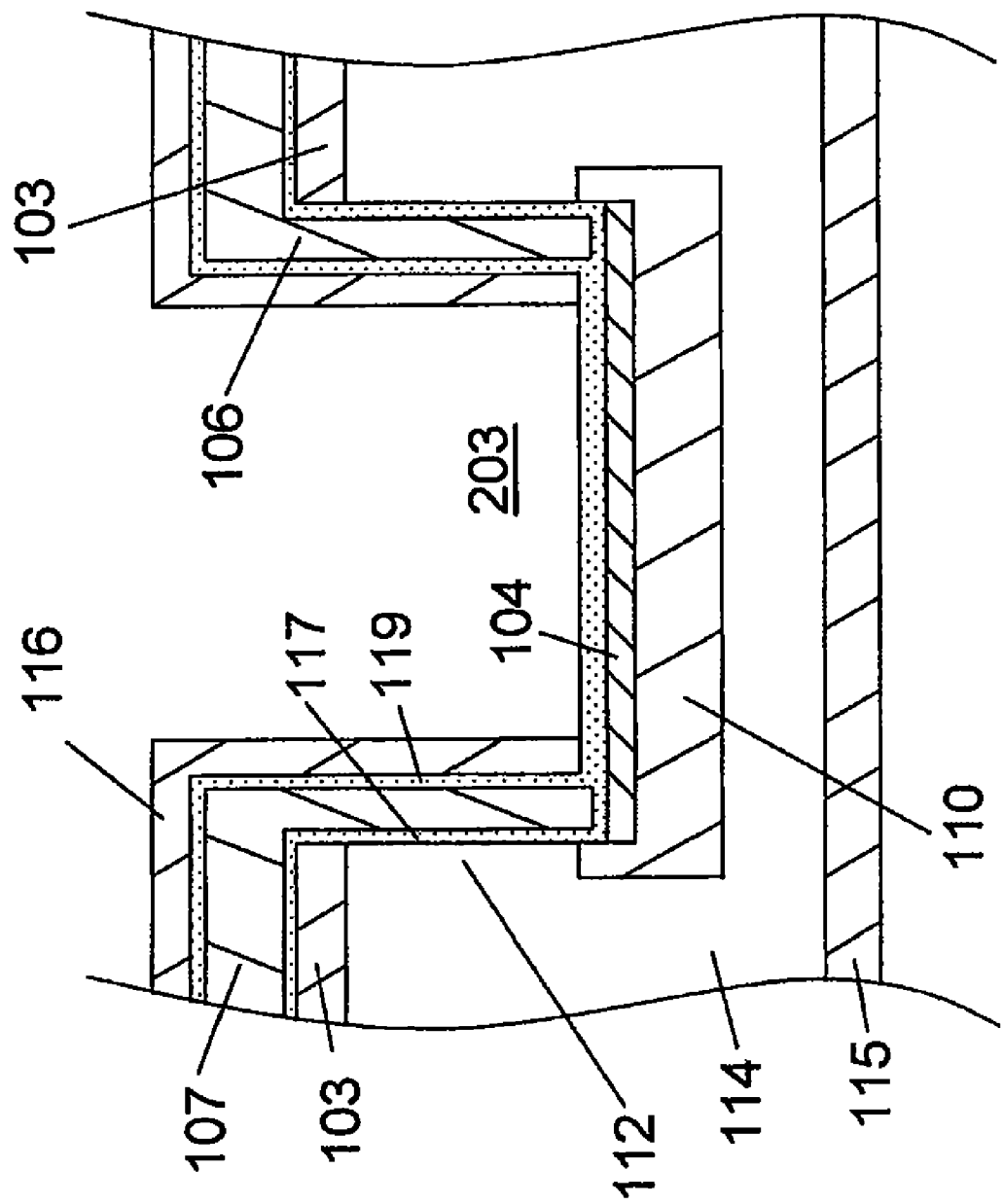
FIG. 5 is a sectional view taken along the line $Y_1$-$Y'_1$ in FIG. 2.

FIGS. 2 and 3 are, respectively, a top plan view and a bird's-eye view showing a solid-state image pickup device comprising a plurality of CCD solid-state image pickup elements according to a first embodiment of the present invention which are arranged in an one-row×two column array. FIGS. 4 and 5 are a sectional view taken along the line $X_1$-$X'_1$ in FIG. 2 and a sectional view taken along the line $Y_1$-$Y'_1$ in FIG. 2, respectively.

In the solid-state image pickup device, a p-type well region 114 is formed in an upper region of an n-type substrate 115, and a silicon hole portion 203 is formed in the p-type well region 114 to define a hole therein. A p+-type region 104 is formed in a bottom wall of the silicon hole portion 203, and a p+-type element isolation region 101 is formed in a part of a sidewall of the silicon hole portion 203 in connected relation to the p+-type region 104. An n-type photoelectric conversion region 110 is formed in a portion of the p-type well region 114 located beneath the p+-type region 104 and in a part of a lower portion of the sidewall of the silicon hole portion 203, and two transfer electrodes 106, 107 are formed on the sidewall of the silicon hole portion 203 through a gate dielectric film 117. An n-type CCD channel region 103 is formed in a top surface of the p-type well region 114 and in a part of an upper region of the remaining part of the sidewall of the silicon hole portion 203, and a read channel 112 is formed in a region of the p-type well region 114 sandwiched between the n-type photoelectric conversion region 110 and the n-type CCD channel region 103.

Further, a silicon hole portion 204 is formed in the p-type well region 114 to define a hole therein. A p+-type region 105 is formed in a bottom wall of the silicon hole portion 204, and a p+-type element isolation region 102 is formed in a part of a sidewall of the silicon hole portion 204 in connected relation to the p+-type region 105. An n-type photoelectric conversion region 111 is formed in a portion of the p-type well region 114 located beneath the p+-type region 105 and in a part of a lower portion of the sidewall of the silicon hole portion 204, and the transfer electrodes 106, 107 are also formed on the sidewall of the silicon hole portion 204 through the gate dielectric film 117. An n-type CCD channel region 109 is formed in a top surface of the p-type well region 114 and in a part of an upper region of the remaining part of the sidewall of the silicon hole portion 204, and a read channel 113 is formed in a region of the p-type well region 114 sandwiched between the n-type photoelectric conversion region 111 and the n-type CCD channel region 109.

The p+-type element isolation region 101 is formed between the n-type CCD channel regions 108, 103 to prevent contact therebetween. The p+-type element isolation region 102 is also formed between the n-type CCD channel regions 103, 108 to prevent contact therebetween.

A metal shield film 116 is formed above the transfer electrodes 106, 107 and on the sidewalls of the silicon hole portions 203, 204, through a dielectric film 119.

In the above solid-state image pickup device, when a read signal is applied to the transfer electrode 106 (or 107), signal charges stored in the n-type photoelectric conversion region 110 (or 111) serving as a charge storage layer are read out to the n-type CCD channel region 103 (or 108) via the read channel 112 (or 113). The readout signal charges are transferred in a vertical ($Y_1$-$Y_1'$) direction through the transfer electrode 106 (or 107).

Second Embodiment

Figure 26:
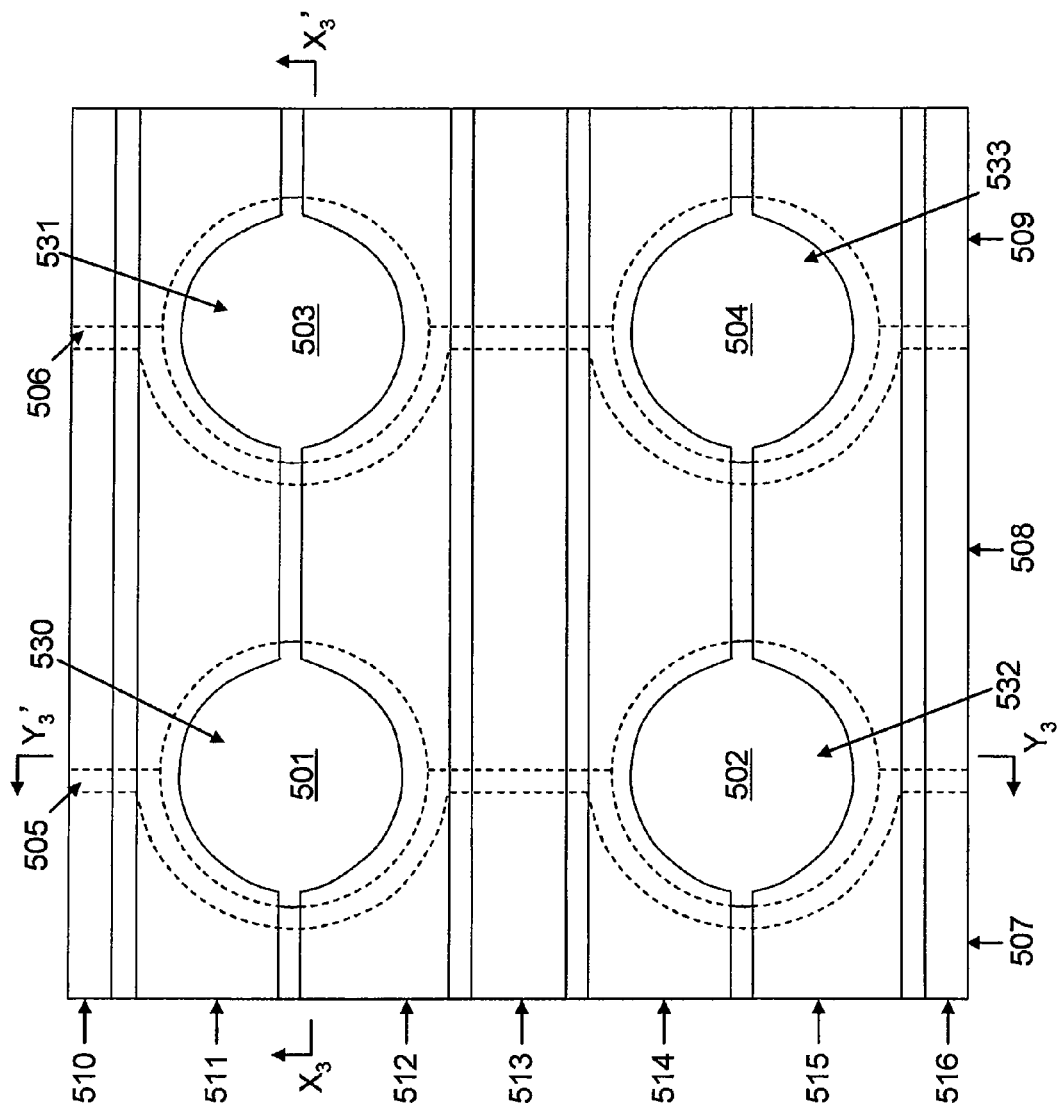
FIG. 26 is a fragmentary top plan view of a solid-state image pickup device comprising a plurality of CCD solid-state image pickup elements arranged in a matrix array, according to yet another embodiment of the present invention.
Figure 27:
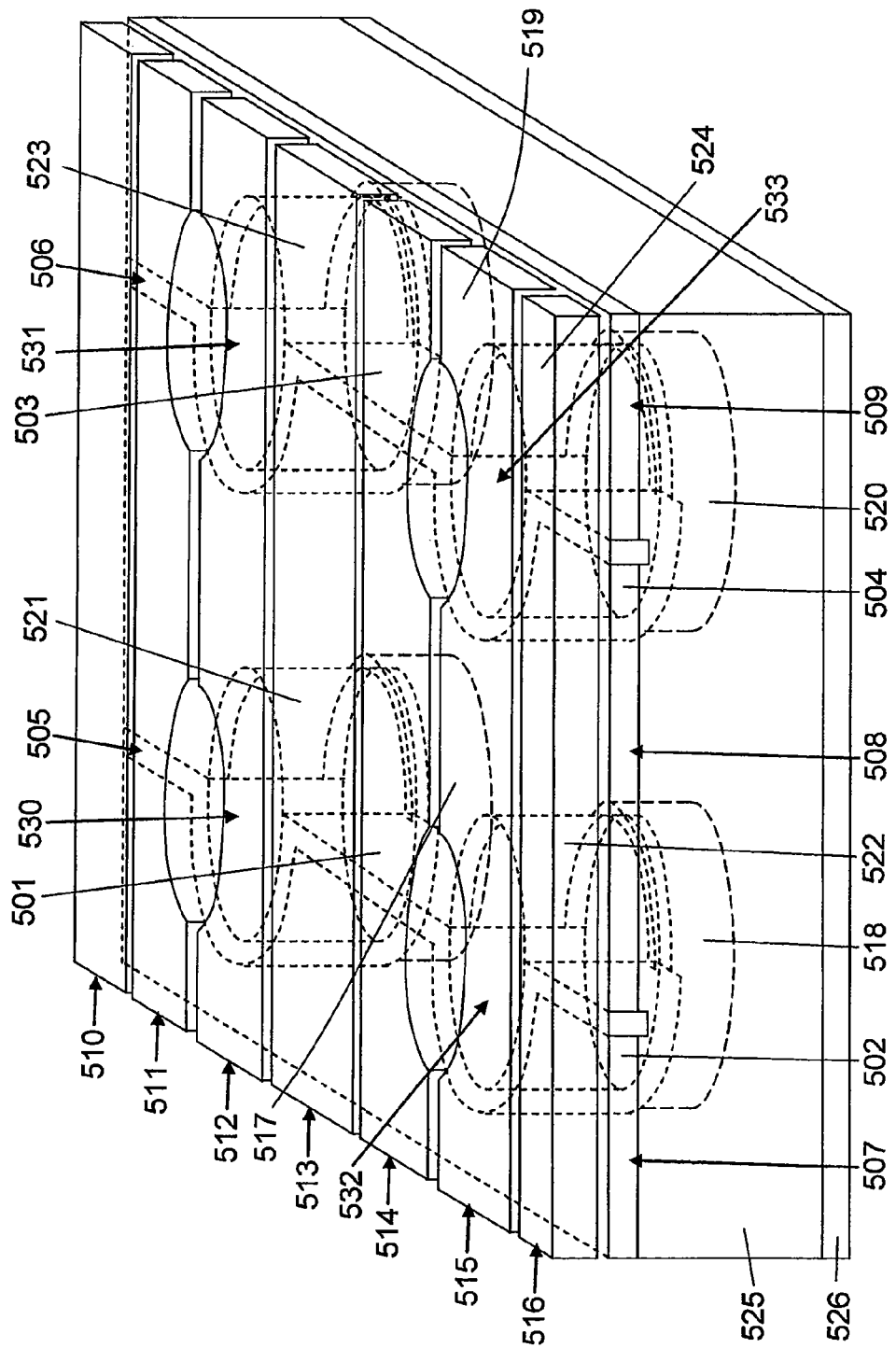
FIG. 27 is a fragmentary bird's-eye view of the solid-state image pickup device according to the embodiment.
Figure 28:
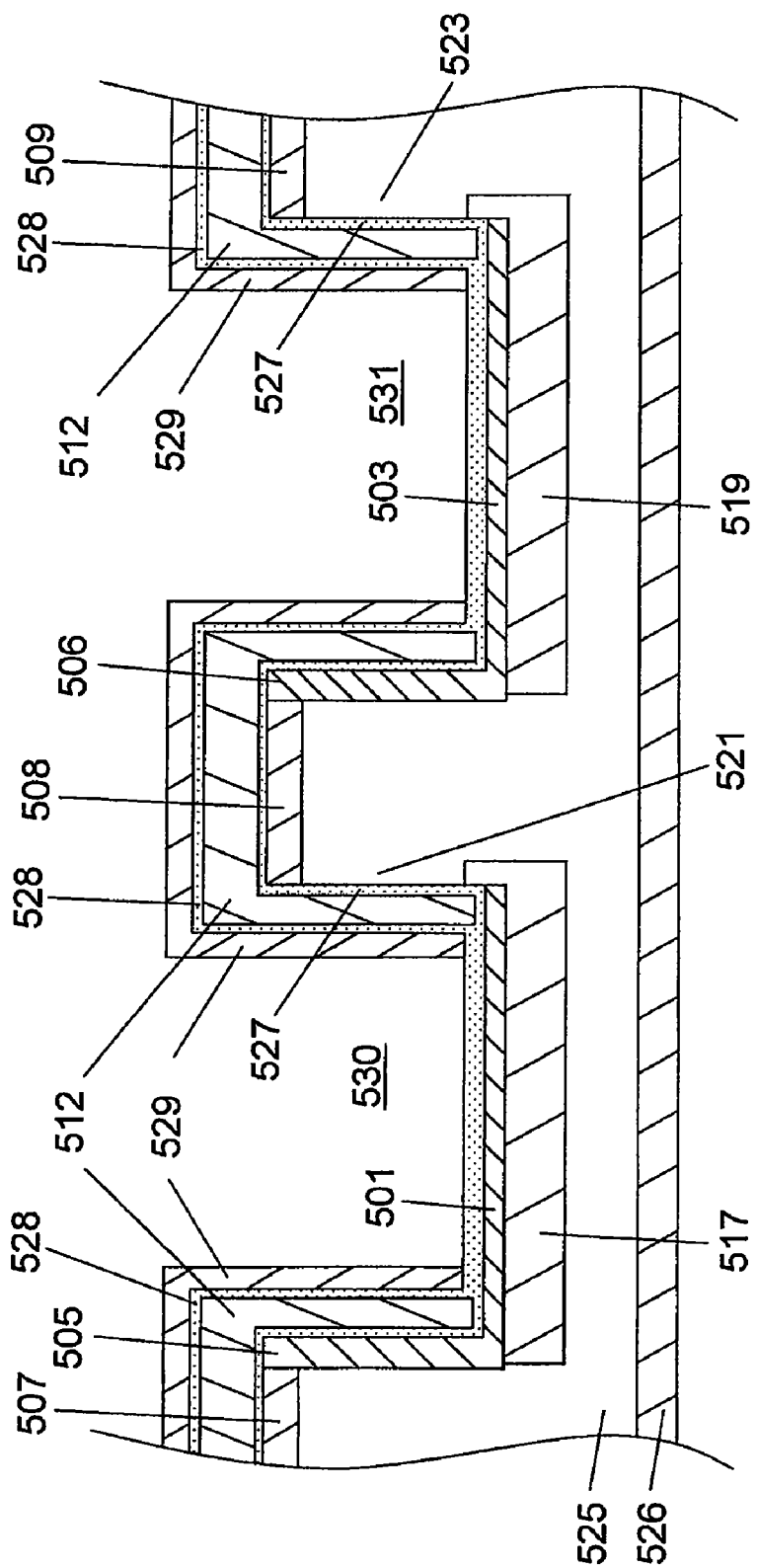
FIG. 28 is a sectional view taken along the line $X_3$-$X'_3$ in FIG. 26.
Figure 29:
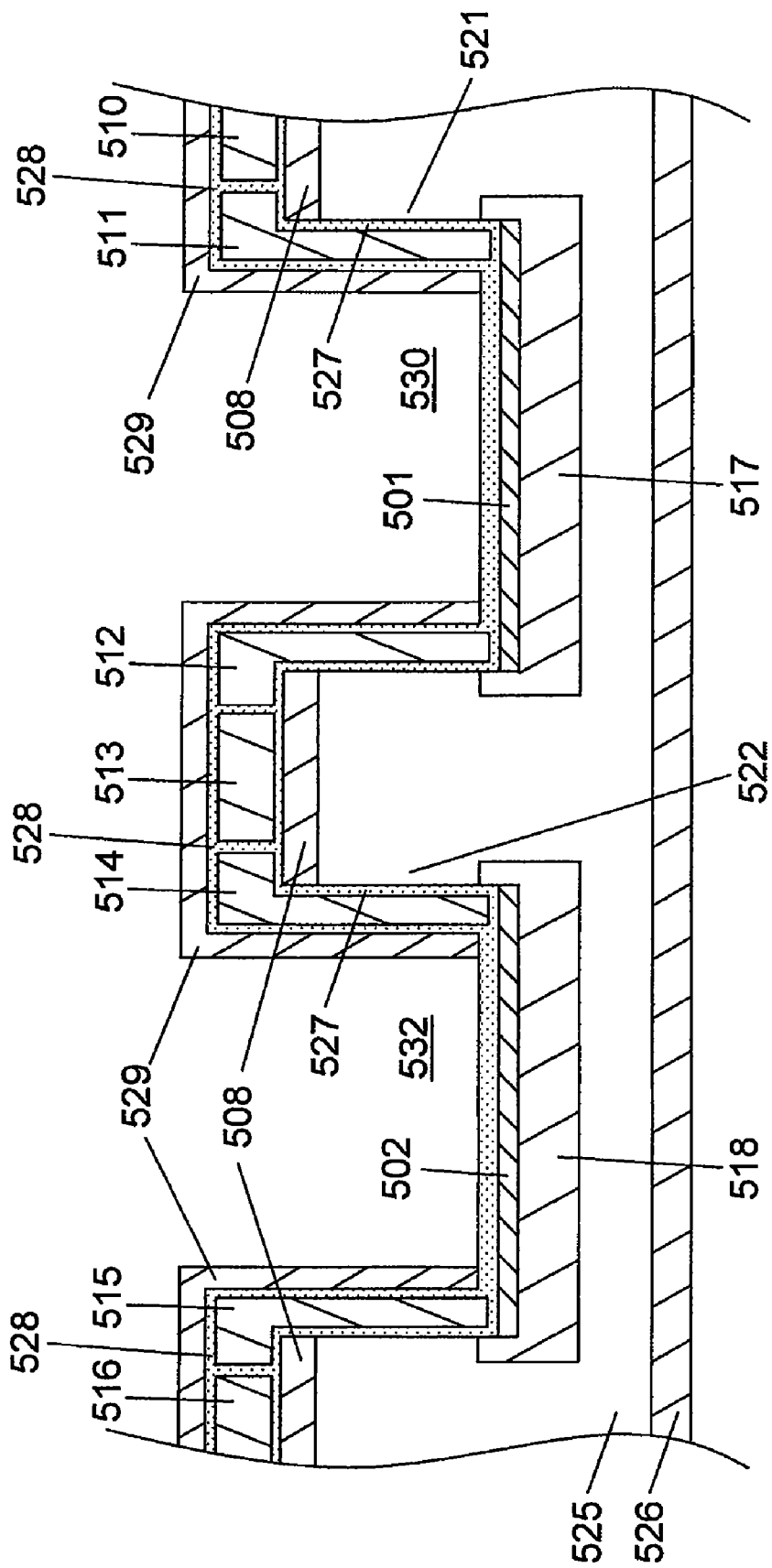
FIG. 29 is a sectional view taken along the line $Y_3$-$Y'_3$ in FIG. 26.

FIGS. 26 and 27 are, respectively, a fragmentary top plan view and a fragmentary bird's-eye view showing a solid-state image pickup device according to a second embodiment of the present invention, wherein a plurality of CCD solid-state image pickup elements each having fundamentally the same structure as that of the CCD solid-state image pickup element according to the first embodiment are arranged in a matrix array. FIGS. 28 and 29 are a sectional view taken along the line $X_3$-$X_3'$ in FIG. 26 and a sectional view taken along the line $Y_3$-$Y_3'$ in FIG. 26, respectively. The solid-state image pickup device according to the second embodiment generally has a symmetrical arrangement. Thus, the following description will be made primarily about only an area illustrated in FIGS. 26 and 27.

As shown in FIGS. 26 and 27, a solid-state image pickup element having a p+-type region 501 and a solid-state image pickup element having a p+-type region 502 are arranged on a semiconductor substrate in a vertical ($Y_3$-$Y_3$') direction (column direction) at given intervals (vertical pixel pitches VP) to form a first solid-state image pickup element column. Further, a solid-state image pickup element having a p+-type region 503 and a solid-state image pickup element having a p+-type region 504 are arranged on the semiconductor substrate in the vertical direction at the same intervals (same vertical pixel pitches VP) as those in the first solid-state image pickup element column, in adjacent relation to and at the same vertical (column-wise) positions as corresponding ones of the solid-state image pickup elements in the first solid-state image pickup element column, to form a second solid-state image pickup element column. The first solid-state image pickup element column and the second solid-state image pickup element column are arranged in spaced-apart relation to each other in a row direction by the same distance (horizontal pixel pitch HP) as the vertical pixel pitch VP. In this manner, the solid-state image pickup elements having the p+-type regions 501, 502, 503, 504 are arranged in a so-called matrix array.

An n-type CCD channel region 508 is provided between corresponding ones of two silicon hole portions 530, 532 in the first solid-state image pickup element column and two silicon hole portions 531, 533 in the second solid-state image pickup element column arranged adjacent to the first solid-state image pickup element column, to read signal charges generated in a photodiode having the p+-type region 501 and a photodiode having the p+-type region 502, and transfer the readout signal charges in the vertical direction. In the same manner, two n-type CCD channel regions 507, 509 are provided to transfer signal charges generated in other photodiodes in the vertical direction.

Each of the n-type CCD channel regions is formed to extend between the silicon hole portions arranged in a matrix array, in the vertical direction. Two p+-type element isolation regions 505, 506 are provided to isolate adjacent ones of the n-type CCD channel regions from each other without contact therebetween.

The p+-type element isolation region 505 is also formed in a part of sidewalls of the silicon hole portions 530, 532 in connected relation to the p+-type regions 501, 502 to apply a voltage to the p+-type regions 501, 502.

The p+-type element isolation region 506 is also formed in a part of sidewalls of the silicon hole portions 531, 533 in connected relation to the p+-type regions 503, 504 to apply a voltage to the p+-type regions 503, 504.

In the second embodiment, each of the p+-type element isolation regions 505, 506 is provided along an axis of an associated one of the first and second solid-state image pickup element columns and a part of outer peripheries of associated ones of the silicon hole portions. Alternatively, as long as each of the p+-type element isolation regions is provided to prevent contact between adjacent ones of the n-type CCD channel regions, and formed as a part of the sidewalls of associated ones of the silicon hole portions in connected relation to associated ones of the p+-type regions, it may be arranged at any suitable position other than that in FIG. 25, such as a position displaced from that in FIG. 25 in an $X_3$ direction.

Three transfer electrodes 512, 513, 514 are provided between each of the silicon hole portions 530, 531 in a first solid-state image pickup element row where the solid-state image pickup element having the p+-type region 501 and the solid-state image pickup element having the p+-type region 503 are arranged in a horizontal ($X_2$-$X_2$') direction (row direction), and a corresponding one of the silicon hole portions 532, 533 in a second solid-state image pickup element row where the solid-state image pickup element having the p+-type region 502 and the solid-state image pickup element having the p+-type region 504 are arranged in the horizontal direction, to transfer signal charges read out from associated ones of the photodiodes to the n-type CCD channel regions 507, 508, 509, in the vertical direction.

Further, four transfer electrodes 510, 511, 515, 516 are provided to transfer signal charges read out from other photodiodes to the n-type CCD channel regions 507, 508, 509, in the vertical direction. When a read signal is selectively applied, for example, to the transfer electrode 514, signal charges stored in the photodiodes having the p+-type regions 502, 504 are read out to the n-type CCD channel regions 508, 509 via respective associated read channels. Each of the transfer electrodes is formed to extend in the horizontal direction and between the silicon hole portions arranged in the matrix array.

In the solid-state image pickup element having the p+-type region 501, a p-type well region 525 is formed in an upper region of an n-type substrate 526, and the silicon hole portion 530 is formed in the p-type well region 525 to define a hole therein. The p+-type region 501 is formed in a bottom wall of the silicon hole portion 530, and the p+-type element isolation region 505 is formed in a part of the sidewall of the silicon hole portion 530 in connected relation to the p+-type region 501. An n-type photoelectric conversion region 517 is formed in a portion of the p-type well region 523 located beneath the p+-type region 501 and in a part of a lower portion of the sidewall of the silicon hole portion 530, and the transfer electrodes 511, 512 are formed on the sidewall of the silicon hole portion 530 through a gate dielectric film 527. The n-type CCD channel region 508 is formed in a top surface of the p-type well region 525 and in a part of an upper region of the remaining part of the sidewall of the silicon hole portion 530, and the read channel 521 is formed in a region of the p-type well region 525 sandwiched between the n-type photoelectric conversion region 517 and the n-type CCD channel region 508.

In the solid-state image pickup element having the p+-type region 502, the silicon hole portion 532 is formed in the p-type well region 525 to define a hole therein. The p+-type region 502 is formed in a bottom wall of the silicon hole portion 532, and the p+-type element isolation region 505 is formed in a part of a sidewall of the silicon hole portion 532 in connected relation to the p+-type region 502. An n-type photoelectric conversion region 518 is formed in a portion of the p-type well region 525 located beneath the p+-type region 502 and in a part of a lower portion of the sidewall of the silicon hole portion 532, and the transfer electrodes 514, 515 are also formed on the sidewall of the silicon hole portion 532 through the gate dielectric film 527. The n-type CCD channel region 508 is formed in a top surface of the p-type well region 525 and in a part of an upper region of the remaining part of the sidewall of the silicon hole portion 532, and the read channel 522 is formed in a region of the p-type well region 525 sandwiched between the n-type photoelectric conversion region 518 and the n-type CCD channel region 508.

In the solid-state image pickup element having the p+-type region 503, the silicon hole portion 531 is formed in the p-type well region 525 to define a hole therein. The p+-type region 503 is formed in a bottom wall of the silicon hole portion 531, and the p+-type element isolation region 506 is formed in a part of a sidewall of the silicon hole portion 531 in connected relation to the p+-type region 503. An n-type photoelectric conversion region 519 is formed in a portion of the p-type well region 525 located beneath the p+-type region 503 and in a part of a lower portion of the sidewall of the silicon hole portion 531, and the transfer electrodes 511, 512 are also formed on the sidewall of the silicon hole portion 531 through the gate dielectric film 527. The n-type CCD channel region 509 is formed in a top surface of the p-type well region 525 and in a part of an upper region of the remaining part of the sidewall of the silicon hole portion 531, and the read channel 523 is formed in a region of the p-type well region 525 sandwiched between the n-type photoelectric conversion region 519 and the n-type CCD channel region 509.

In the solid-state image pickup element having the p+-type region 504, the silicon hole portion 533 is formed in the p-type well region 525 to define a hole therein. The p+-type region 504 is formed in a bottom wall of the silicon hole portion 533, and the p+-type element isolation region 506 is formed in a part of a sidewall of the silicon hole portion 533 in connected relation to the p+-type region 504. An n-type photoelectric conversion region 520 is formed in a portion of the p-type well region 525 located beneath the p+-type region 504 and in a part of a lower portion of the sidewall of the silicon hole portion 533, and the transfer electrodes 514, 515 are also formed on the sidewall of the silicon hole portion 533 through the gate dielectric film 527. The n-type CCD channel region 509 is formed in a top surface of the p-type well region 525 and in a part of an upper region of the remaining part of the sidewall of the silicon hole portion 533, and the read channel 524 is formed in a region of the p-type well region 525 sandwiched between the n-type photoelectric conversion region 520 and the n-type CCD channel region 509.

A metal shield film 529 is formed above the transfer electrodes 510, 511, 512, 513, 514, 515, 516 and on the sidewalls of the silicon hole portions 501, 502, 503, 504 through a dielectric film 528.

As above, each of the transfer electrode 510, 511, 512, 513, 514, 515, 516 is formed to extend in the row direction in a region between the silicon hole portions in adjacent ones of the solid-state image pickup element rows, while passing through the respective silicon hole portions in the adjacent solid-state image pickup element rows, wherein the transfer electrode are arranged in spaced-apart relation to each other by a given distance. Each of the transfer electrodes 511, 512, 514, 515 located adjacent to associated ones of the silicon hole portions is formed on the sidewall of the associated silicon wall through the gate dielectric film. In cooperation with the n-type CCD channel regions, the transfer electrode 510, 511, 512, 513, 514, 515, 516 make up a vertical charge transfer device (VCCD) for transferring signal charges generated in the photodiodes in the vertical direction. The VCCD is configured as a three-phase driven type ($\phi1$ to $\phi3$) in which three transfer electrodes are provided in each of the photodiodes, and adapted to be driven in respective different phases so as to transfer signal charges generated in the photodiode, in the vertical direction. Although the VCCD in the second embodiment is a three-phase driven type, it is apparent to those skilled in the art that the VCCD may be configured to be driven in any other suitable number of phases.

Third Embodiment

Figure 22:
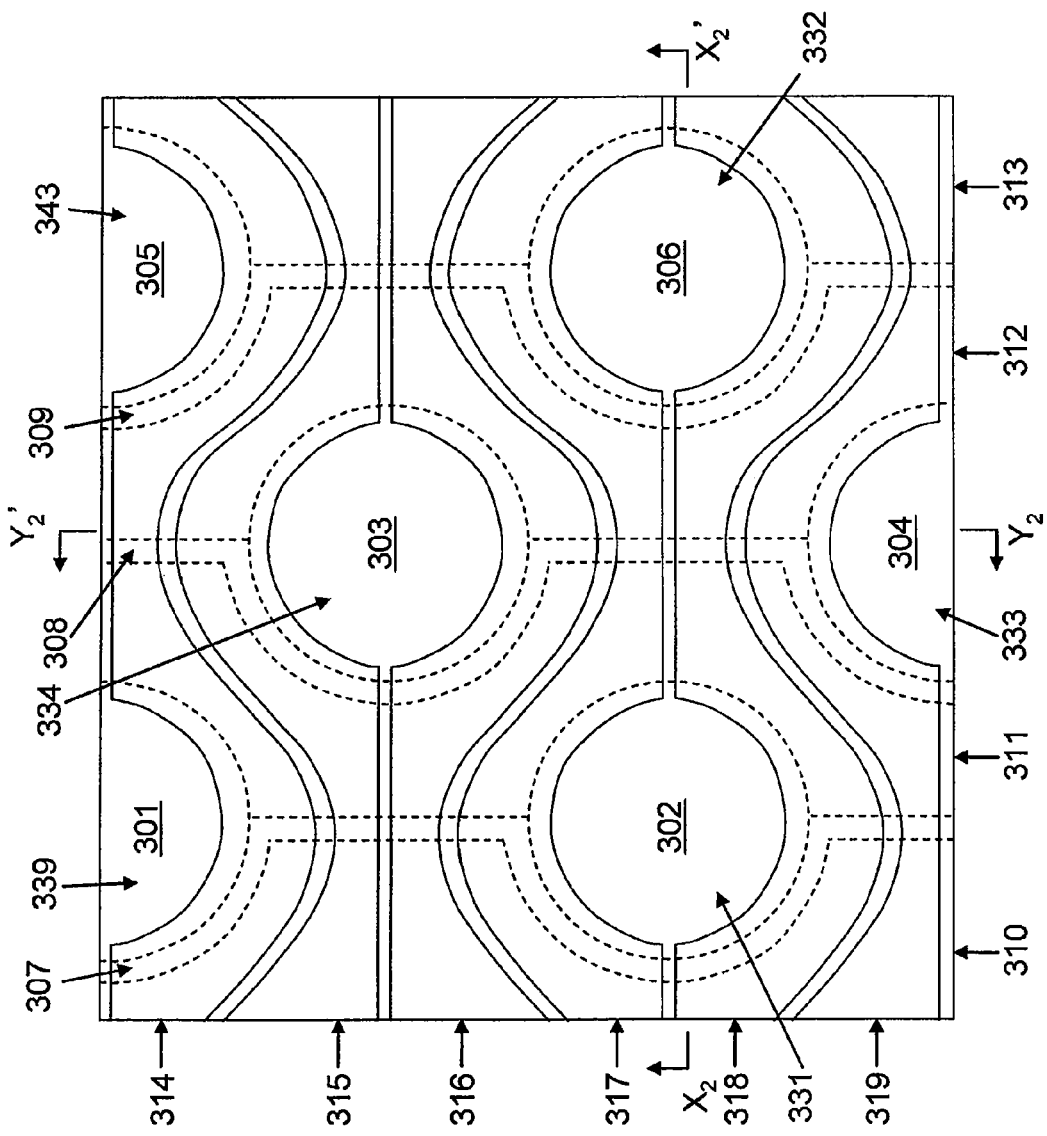
FIG. 22 is a fragmentary top plan view of a solid-state image pickup device comprising a plurality of CCD solid-state image pickup elements arranged in a honeycomb array, according to another embodiment of the present invention.
Figure 23:
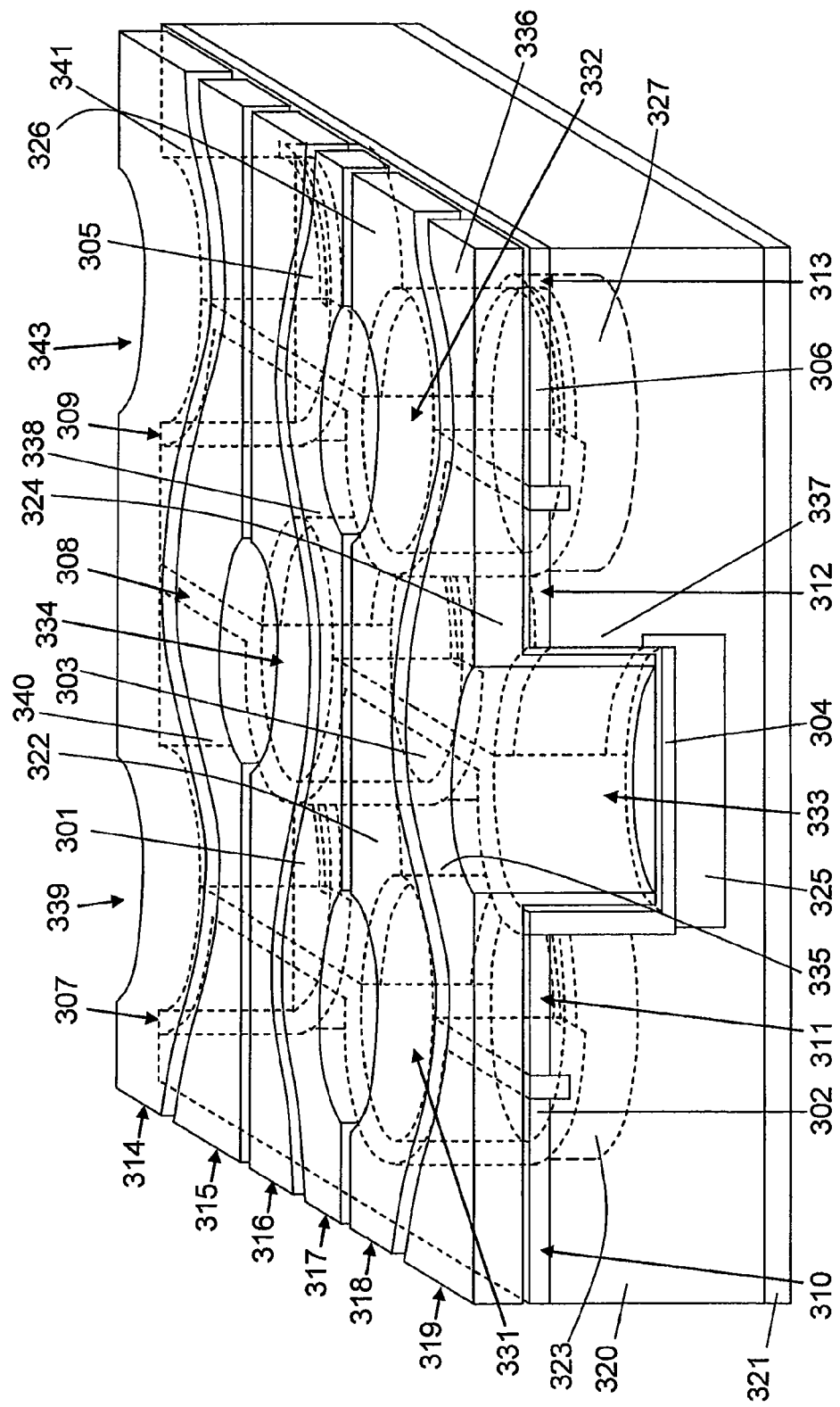
FIG. 23 is a fragmentary bird's-eye view of the solid-state image pickup device according to the embodiment.
Figure 24:
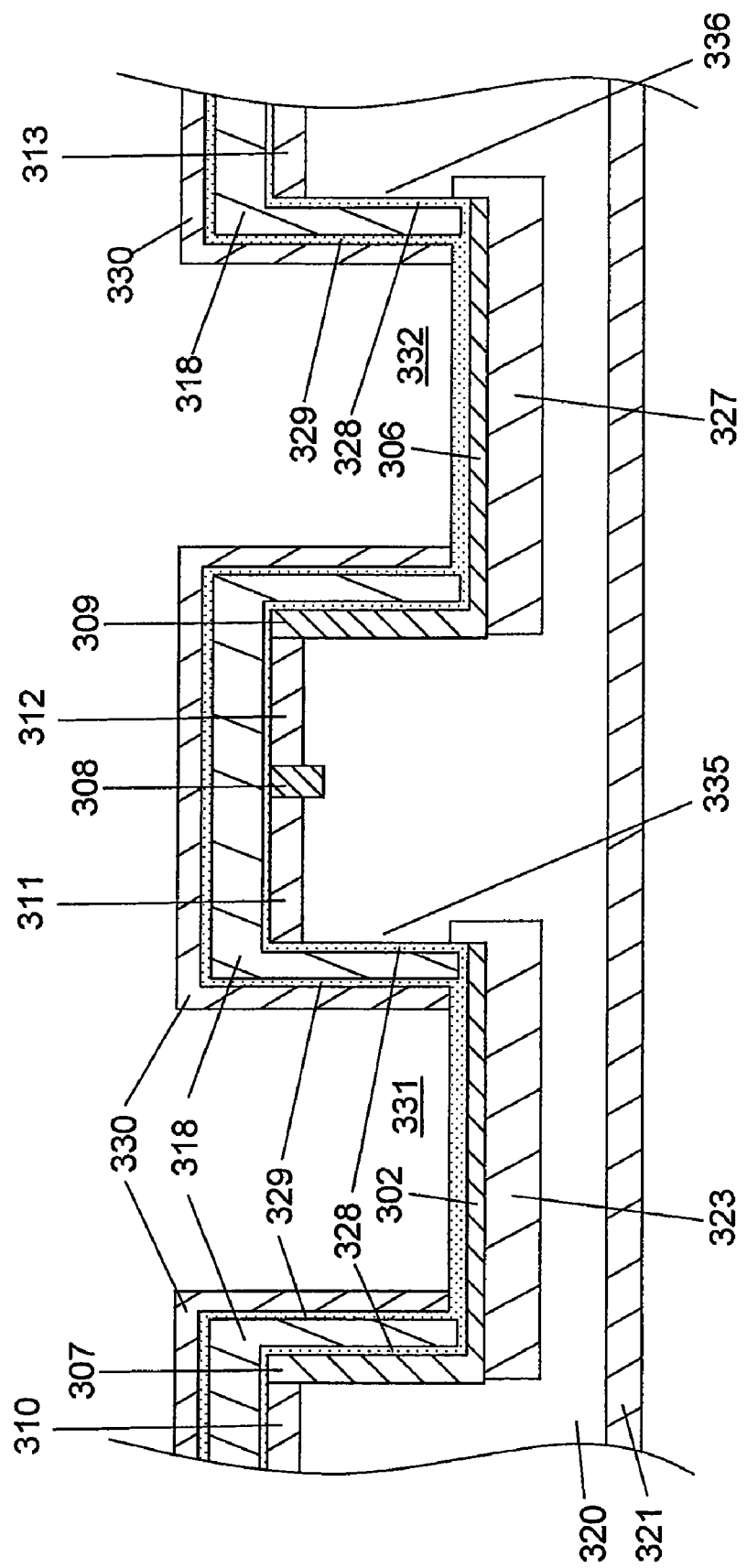
FIG. 24 is a sectional view taken along the line $X_2$-$X'_2$ in FIG. 22.
Figure 25:
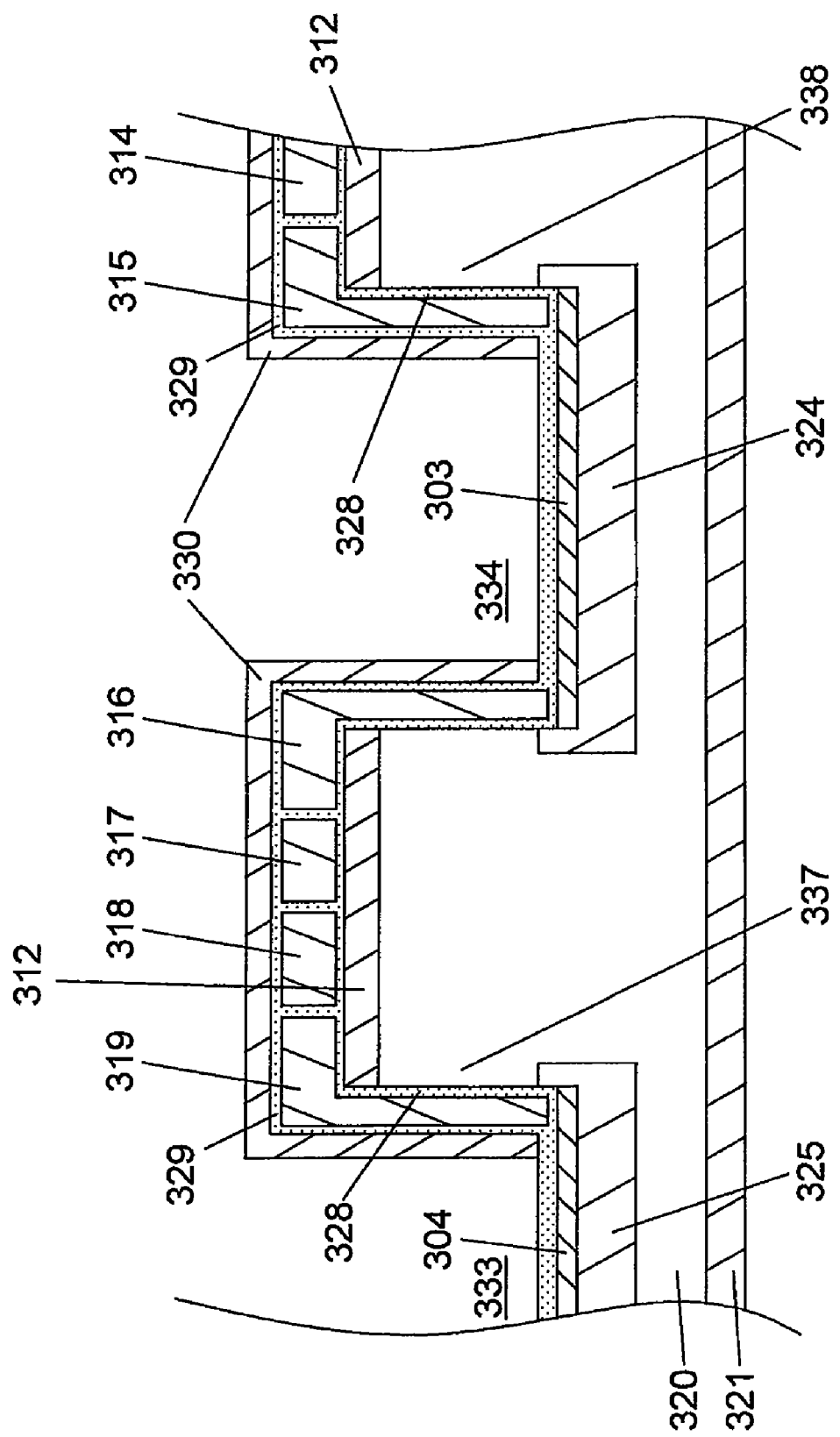
FIG. 25 is a sectional view taken along the line $Y_2$-$Y'_2$ in FIG. 22.

In the second embodiment, a solid-state image pickup device comprising a plurality of CCD image pickup elements arranged in a matrix array has been shown and described. Alternatively, as shown in FIGS. 22, 23, 24 and 25, the solid-state image pickup elements may be arranged in a honeycomb array. In this connection, as a third embodiment of the present invention, a solid-state image pickup device will be described in which a plurality of CCD image pickup elements each having fundamentally the same structure as that of the CCD solid-state image pickup element according to the first embodiment are arranged in a honeycomb array. FIGS. 22 and 23 are, respectively, a fragmentary top plan view and a fragmentary bird's-eye view showing a solid-state image pickup device comprising a plurality of CCD image pickup elements arranged in a honeycomb array. FIGS. 24 and 25 are a sectional view taken along the line $X_2$-$X_2'$ in FIG. 22 and a sectional view taken along the line $Y_2$-$Y_2'$ in FIG. 22, respectively. The solid-state image pickup device according to the third embodiment generally has a symmetrical arrangement. Thus, the following description will be made primarily about only an area illustrated in FIGS. 22 and 23.

As shown in FIGS. 22 and 23, a solid-state image pickup element having a p+-type region 301 and a solid-state image pickup element having a p+-type region 302 are arranged on a semiconductor substrate in a vertical ($Y_2$-$Y_2'$) direction (column direction) at given intervals (vertical pixel pitches VP) to form a first solid-state image pickup element column.

Further, a solid-state image pickup element having a p+-type region 303 and a solid-state image pickup element having 304 are arranged on the semiconductor substrate in the vertical direction at the same intervals (same vertical pixel pitches VP) as those in the first solid-state image pickup element column, in spaced-apart relation to the first solid-state image pickup element column in a direction perpendicular to the vertical direction (i.e., horizontal direction) by ½ of a horizontal pixel pitch HP equal to the vertical pixel pitch and in displaced relation to the first solid-state image pickup element column in the vertical direction by ½ of the vertical pixel pitch, to form a second solid-state image pickup element column.

Further, a solid-state image pickup element having a p+-type region 305 and a solid-state image pickup element having 306 are arranged on the semiconductor substrate in the vertical direction at the same intervals (same vertical pixel pitches VP) as those in the first solid-state image pickup element column, in spaced-apart relation to the second solid-state image pickup element column in the horizontal direction by ½ of a horizontal pixel pitch HP equal to the vertical pixel pitch and in displaced relation to the second solid-state image pickup element column in the vertical direction by ½ of the vertical pixel pitch, to form a third solid-state image pickup element column.

In this manner, the solid-state image pickup elements having the p+-type regions 301, 302, 303, 304, 305, 306 are arranged in a honeycomb array.

An n-type CCD channel region 331 is provided between corresponding ones of two silicon hole portions 339, 331 in the first solid-state image pickup element column and two silicon hole portions 334, 333 in the second solid-state image pickup element column arranged adjacent to the first solid-state image pickup element column, to read signal charges generated in a photodiode having the p+-type region 301 and a photodiode having the p+-type region 302, and transfer the readout signal charges in the vertical direction.

In the same manner, an n-type CCD channel region 312 is provided between corresponding ones of two silicon hole portions 334, 333 in the second solid-state image pickup element column and two silicon hole portions 305, 306 in the third solid-state image pickup element column to read signal charges generated in a photodiodes having the p+-type region 303 and a photodiodes having the p+-type region 304, and transfer the readout signal charges in the vertical direction.

Further, an n-type CCD channel region 313 is provided to read signal charges generated in a photodiode having the p+-type region 305 and a photodiode having the p+-type region 306, and transfer the readout signal charges in the vertical direction.

An n-type CCD channel region 310 is provided to read signal charges generated in other photodiodes and transfer the readout signal charges in the vertical direction.

Each of the n-type CCD channel regions is formed to extend between the silicon hole portions arranged in a honeycomb array, in the vertical direction in a meandering pattern. Further, three p+-type element isolation regions 307, 308, 309 are provided to isolate adjacent ones of the n-type CCD channel regions from each other without contact therebetween.

The p+-type element isolation region 307 is also formed in a part of sidewalls of the silicon hole portions 339, 331 in connected relation to the p+-type regions 301, 302 to apply a voltage to the p+-type regions 301, 302.

The p+-type element isolation region 308 is also formed in a part of sidewalls of the silicon hole portions 334, 333 in connected relation to the p+-type regions 303, 304 to apply a voltage to the p+-type regions 303, 304.

The p+-type element isolation region 309 is also formed in a part of sidewalls of the silicon hole portions 343, 332 in connected relation to the p+-type regions 305, 306 to apply a voltage to the p+-type regions 305, 305.

In the third embodiment, each of the p+-type element isolation regions 307, 308, 309 is provided along an axis of an associated one of the first to third solid-state image pickup element columns and a part of outer peripheries of associated ones of the silicon hole portions. Alternatively, as long as each of the p+-type element isolation regions is provided to prevent contact between adjacent ones of the n-type CCD channel regions, and formed as a part of the sidewalls of associated ones of the silicon hole portions in connected relation to associated ones of the p+-type regions, it may be arranged at any suitable position other than that in FIG. 21, such as a position displaced from that in FIG. 21 in an $X_2$ direction.

Two transfer electrodes 314, 315 are provided between each of the silicon hole portions 339, 343 in a first solid-state image pickup element row where the solid-state image pickup element having the p+-type region 301 and the solid-state image pickup element having the p+-type region 303 are arranged in a horizontal ($X_2$-$X_2'$) direction (row direction), and the silicon hole portion 334 in a second solid-state image pickup element row where the solid-state image pickup element having the p+-type region 303 and other solid-state image pickup element having a p+-type regions (not shown) are arranged in the horizontal direction.

Further, two transfer electrodes 316, 317 are provided between the silicon hole portion 334 in the second solid-state image pickup element row, and each of the silicon hole portions 331, 332 in a third solid-state image pickup element row where the solid-state image pickup element having the p+-type region 302 and the solid-state image pickup element having the p+-type region 306 are arranged in the horizontal direction, and two transfer electrodes 318, 319 are provided between each of the silicon hole portions 331, 332 in the third solid-state image pickup element row, and the silicon hole portion 333 in a fourth solid-state image pickup element row where the solid-state image pickup element having the p+-type region 304 and other solid-state image pickup element having a p+-type regions (not shown) are arranged in the horizontal direction. Each of the transfer electrodes is formed to extend in the horizontal direction and between the silicon hole portions arranged in the honeycomb array, in a meandering pattern.

In the solid-state image pickup element having the p+-type region 301, a p-type well region 320 is formed in an upper region of an n-type substrate 321, and the silicon hole portion 339 is formed in the p-type well region 320 to define a hole therein. The p+-type region 301 is formed in a bottom wall of the silicon hole portion 339, and the p+-type element isolation region 307 is formed in a part of the sidewall of the silicon hole portion 339 in connected relation to the p+-type region 301. An n-type photoelectric conversion region 322 is formed in a portion of the p-type well region 320 located beneath the p+-type region 301 and in a part of a lower portion of the sidewall of the silicon hole portion 339, and the transfer electrode 314 is formed on the sidewall of the silicon hole portion 339 through a gate dielectric film 328. The n-type CCD channel region 311 is formed in a top surface of the p-type well region 320 and in a part of an upper region of the remaining part of the sidewall of the silicon hole portion 339, and the read channel 304 is formed in a region of the p-type well region 320 sandwiched between the n-type photoelectric conversion region 322 and the n-type CCD channel region 311.

In the solid-state image pickup element having the p+-type region 302, the silicon hole portion 331 is formed in the p-type well region 320 to define a hole therein. The p+-type region 302 is formed in a bottom wall of the silicon hole portion 331, and the p+-type element isolation region 307 is formed in a part of a sidewall of the silicon hole portion 331 in connected relation to the p+-type region 302. An n-type photoelectric conversion region 323 is formed in a portion of the p-type well region 320 located beneath the p+-type region 302 and in a part of a lower portion of the sidewall of the silicon hole portion 331, and the transfer electrodes 317, 318 are also formed on the sidewall of the silicon hole portion 331 through the gate dielectric film 328. The n-type CCD channel region 311 is formed in a top surface of the p-type well region 320 and in a part of an upper region of the remaining part of the sidewall of the silicon hole portion 331, and the read channel 335 is formed in a region of the p-type well region 320 sandwiched between the n-type photoelectric conversion region 323 and the n-type CCD channel region 311.

In the solid-state image pickup element having the p+-type region 303, the silicon hole portion 334 is formed in the p-type well region 320 to define a hole therein. The p+-type region 303 is formed in a bottom wall of the silicon hole portion 334, and the p+-type element isolation region 308 is formed in a part of a sidewall of the silicon hole portion 334 in connected relation to the p+-type region 303. An n-type photoelectric conversion region 324 is formed in a portion of the p-type well region 320 located beneath the p+-type region 303 and in a part of a lower portion of the sidewall of the silicon hole portion 334, and the transfer electrodes 315, 316 are also formed on the sidewall of the silicon hole portion 334 through the gate dielectric film 328. The n-type CCD channel region 312 is formed in a top surface of the p-type well region 320 and in a part of an upper region of the remaining part of the sidewall of the silicon hole portion 334, and the read channel 338 is formed in a region of the p-type well region 320 sandwiched between the n-type photoelectric conversion region 324 and the n-type CCD channel region 312.

In the solid-state image pickup element having the p+-type region 304, the silicon hole portion 333 is formed in the p-type well region 320 to define a hole therein. The p+-type region 304 is formed in a bottom wall of the silicon hole portion 333, and the p+-type element isolation region 308 is formed in a part of a sidewall of the silicon hole portion 333 in connected relation to the p+-type region 304. An n-type photoelectric conversion region 325 is formed in a portion of the p-type well region 320 located beneath the p+-type region 304 and in a part of a lower portion of the sidewall of the silicon hole portion 333, and the transfer electrode 319 is also formed on the sidewall of the silicon hole portion 333 through the gate dielectric film 328. The n-type CCD channel region 312 is formed in a top surface of the p-type well region 320 and in a part of an upper region of the remaining part of the sidewall of the silicon hole portion 333, and the read channel 337 is formed in a region of the p-type well region 320 sandwiched between the n-type photoelectric conversion region 325 and the n-type CCD channel region 312.

In the solid-state image pickup element having the p+-type region 305, the silicon hole portion 343 is formed in the p-type well region 320 to define a hole therein. The p+-type region 305 is formed in a bottom wall of the silicon hole portion 343, and the p+-type element isolation region 309 is formed in a part of a sidewall of the silicon hole portion 343 in connected relation to the p+-type region 305. An n-type photoelectric conversion region 326 is formed in a portion of the p-type well region 320 located beneath the p+-type region 305 and in a part of a lower portion of the sidewall of the silicon hole portion 343, and the transfer electrode 314 is also formed on the sidewall of the silicon hole portion 343 through the gate dielectric film 328. The n-type CCD channel region 313 is formed in a top surface of the p-type well region 320 and in a part of an upper region of the remaining part of the sidewall of the silicon hole portion 343, and the read channel 341 is formed in a region of the p-type well region 320 sandwiched between the n-type photoelectric conversion region 326 and the n-type CCD channel region 313.

In the solid-state image pickup element having the p+-type region 306, the silicon hole portion 332 is formed in the p-type well region 320 to define a hole therein. The p+-type region 306 is formed in a bottom wall of the silicon hole portion 332, and the p+-type element isolation region 309 is formed in a part of a sidewall of the silicon hole portion 332 in connected relation to the p+-type region 306. An n-type photoelectric conversion region 327 is formed in a portion of the p-type well region 320 located beneath the p+-type region 306 and in a part of a lower portion of the sidewall of the silicon hole portion 332, and the transfer electrodes 317, 318 are also formed on the sidewall of the silicon hole portion 332 through the gate dielectric film 328. The n-type CCD channel region 313 is formed in a top surface of the p-type well region 320 and in a part of an upper region of the remaining part of the sidewall of the silicon hole portion 332, and the read channel 336 is formed in a region of the p-type well region 320 sandwiched between the n-type photoelectric conversion region 327 and the n-type CCD channel region 313.

A metal shield film 330 is formed above the transfer electrodes 314, 315, 316, 317, 318, 319 and on the sidewalls of the silicon hole portions 339, 331, 334, 333, 332 through a dielectric film 329.

As above, each of the transfer electrode 314, 315, 316, 317, 318, 319 is formed to extend in the row direction in a region between the silicon hole portions in adjacent ones of the solid-state image pickup element rows, while passing through the respective silicon hole portions in the adjacent solid-state image pickup element rows. Each of the transfer electrodes 314, 315, 316, 317, 318, 319 is formed on the sidewall of the associated silicon wall through the gate dielectric film, and the transfer electrodes 314, 315, 316, 317, 318, 319 are arranged in spaced apart relation to each other by a given distance. In cooperation with the n-type CCD channel regions, the transfer electrode 314, 315, 316, 317, 318, 319 make up a vertical charge transfer device (VCCD) for transferring signal charges generated in the photodiodes in the vertical direction. The VCCD is configured as a four-phase driven type (φ1 to φ4) in which four transfer electrodes are provided in each of the photodiodes, and adapted to be driven in respective different phases so as to transfer signal charges generated in the photodiode, in the vertical direction. Although the VCCD in the third embodiment is a four-phase driven type, it is apparent to those skilled in the art that the VCCD may be configured to be driven in any other suitable number of phases.

Although not illustrated, as with conventional CCD image sensors, a color filter, a microlens and others are formed on the metal shield film 330 through a protective film and a flattened film.

With reference to FIGS. 6(a) to 21(b), one example of a process of producing the solid-state image pickup element (the solid-state image pickup device) according to the above embodiments will be described below.

In FIGS. 6(a) to 21(b), each figure suffixed by (a) and each figure suffixed by (b) corresponds to a cross-section taken along the line $X_1$-$X_1$' in FIG. 2 and a cross-section taken along the line $Y_1$-$Y_1$' in FIG. 2, respectively.

A p-type well region 114 is formed in an upper region of an n-type silicon substrate 115, and an oxide film 201 is formed on the p-type well region 114 (FIGS. 6(a) and 6(b)).

The oxide film is etched to form an oxide-film mask 202 (FIGS. 7(a) and 7(b)).

The p-type well region 114 is etched to form a silicon hole portion (203, 204) (FIGS. 8(a) and 8(b)).

The resulting product is subjected to an oxidation treatment to form an oxide film (205, 206) thereon in order to prevent the occurrence of ion channeling during an ion-implantation process. Then, polysilicon is deposited thereon, and etched to form a sidewall-shaped polysilicon film (207, 208) as a mask for use in the ion-implantation process (FIGS. 9(a) and 9(b)).

Phosphorus (P) or arsenic (As) is implanted, and the resulting product is subjected to annealing to form an n-type photoelectric conversion region (110, 111) (FIGS. 10(a) and 10(b)).

Figure 11A:
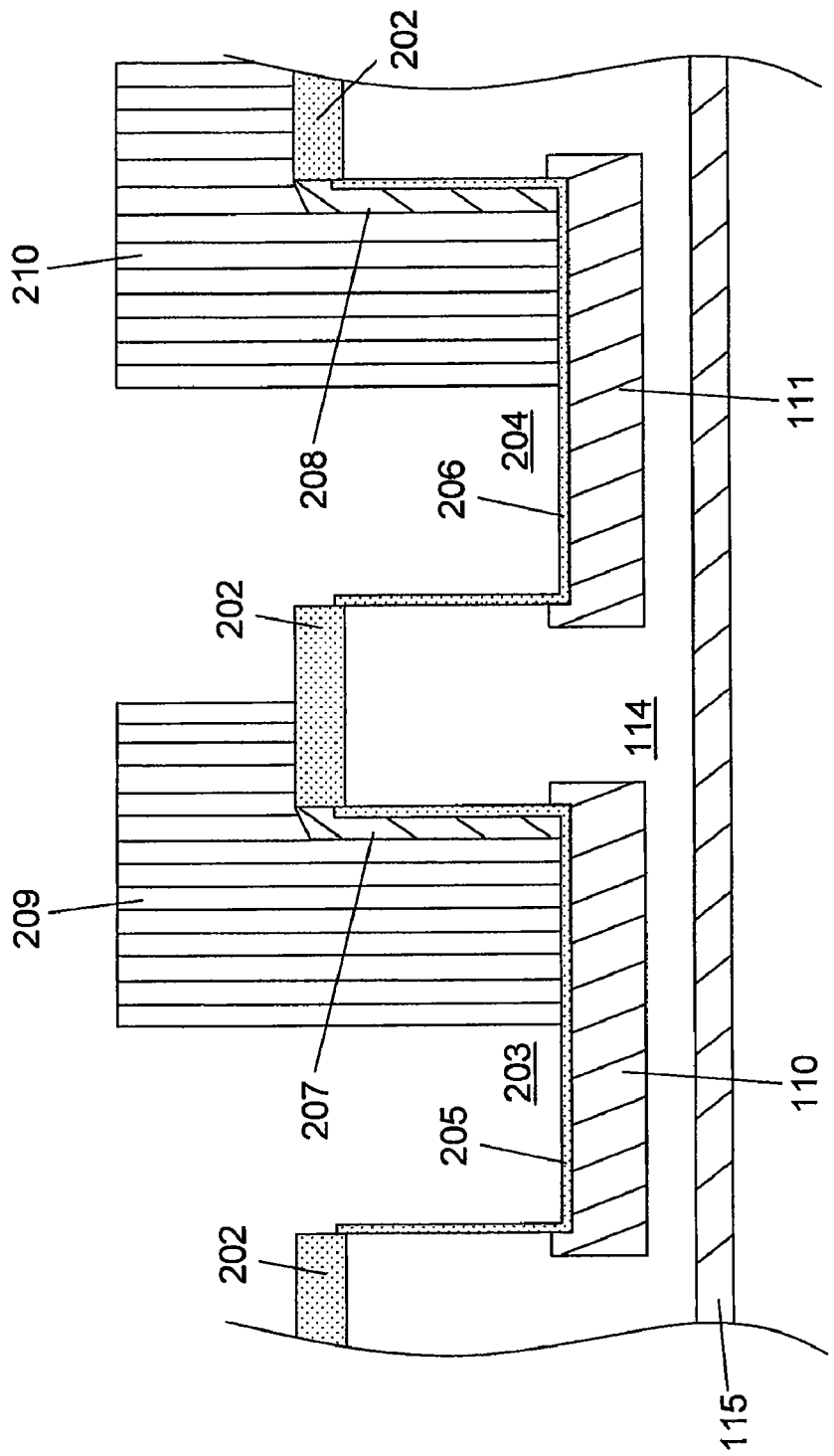
FIG. 11(a) is a sectional view ($X_1$-$X'_1$ section) showing a step of the example of the production process for the CCD solid-state image pickup element according to the embodiment.

A resist (209, 210) is formed, and then a portion of the polysilicon film corresponding to a p+-type element isolation region to be formed in a sidewall of the silicon hole portion is etched (FIGS. 11(a) and 11(b)).

The resist is removed, and then boron is implanted to form a p+-type region (104, 105) (FIGS. 12(a) and 12(b)).

The remaining polysilicon film and the oxide film are removed (FIGS. 13(a) and 13(b)).

An oxide film is deposited, and, after being flattened, etched to form a mask for use in an ion-plantation process (FIGS. 14(a) and 14(b)).

Figure 15A:
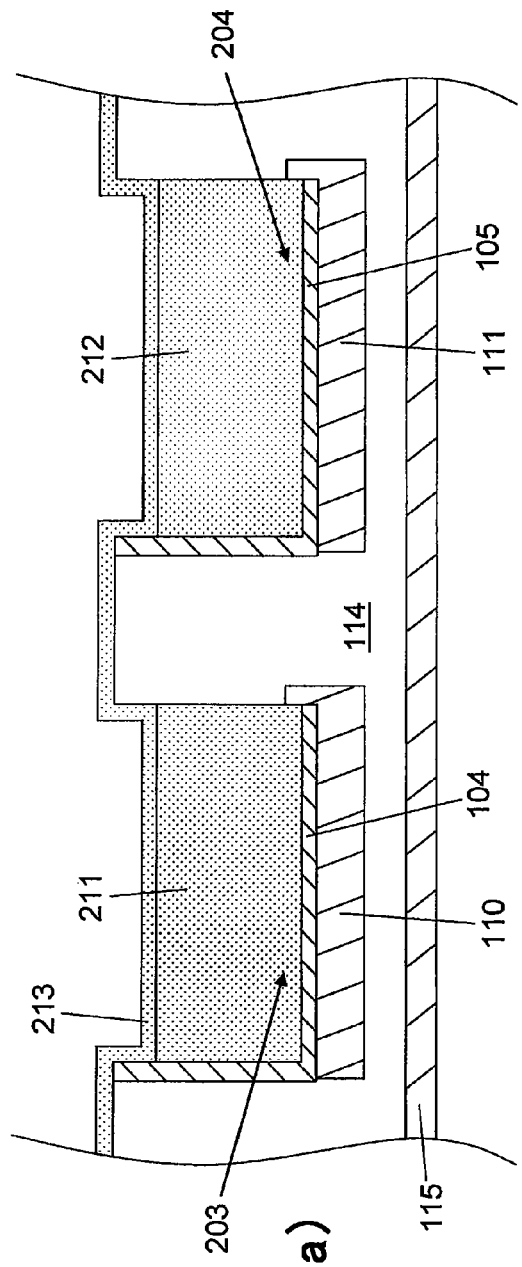
FIG. 15(a) is a sectional view ($X_1$-$X'_1$ section) showing a step of the example of the production process for the CCD solid-state image pickup element according to the embodiment.
Figure 15B:
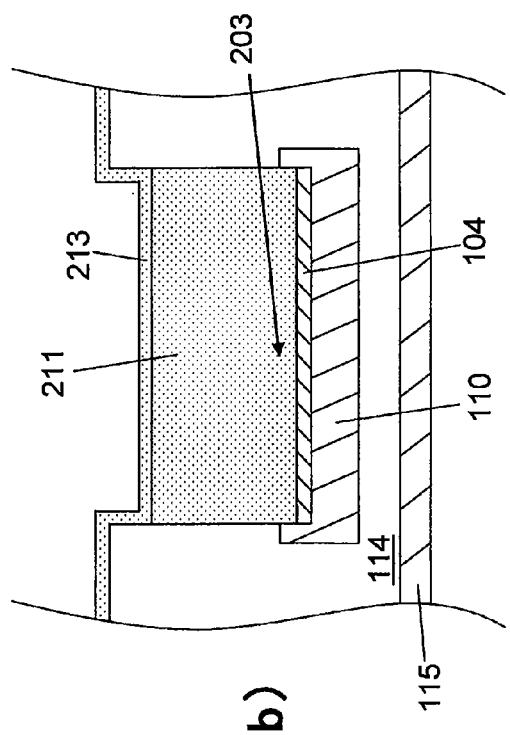
FIG. 15(b) is a sectional view ($Y_1$-$Y'_1$ section) showing the step in FIG. 15(a), in the example of the production process for the CCD solid-state image pickup element according to the embodiment.

An oxide film 213 is deposited to prevent the occurrence of ion channeling during the ion-implantation process (FIGS. 15(a) and 15(b)).

Phosphorus (P) or arsenic (As) is implanted to form an n-type CCD channel region (103, 108, 109) (FIGS. 16(a) and 16(b)).

Figure 17A:
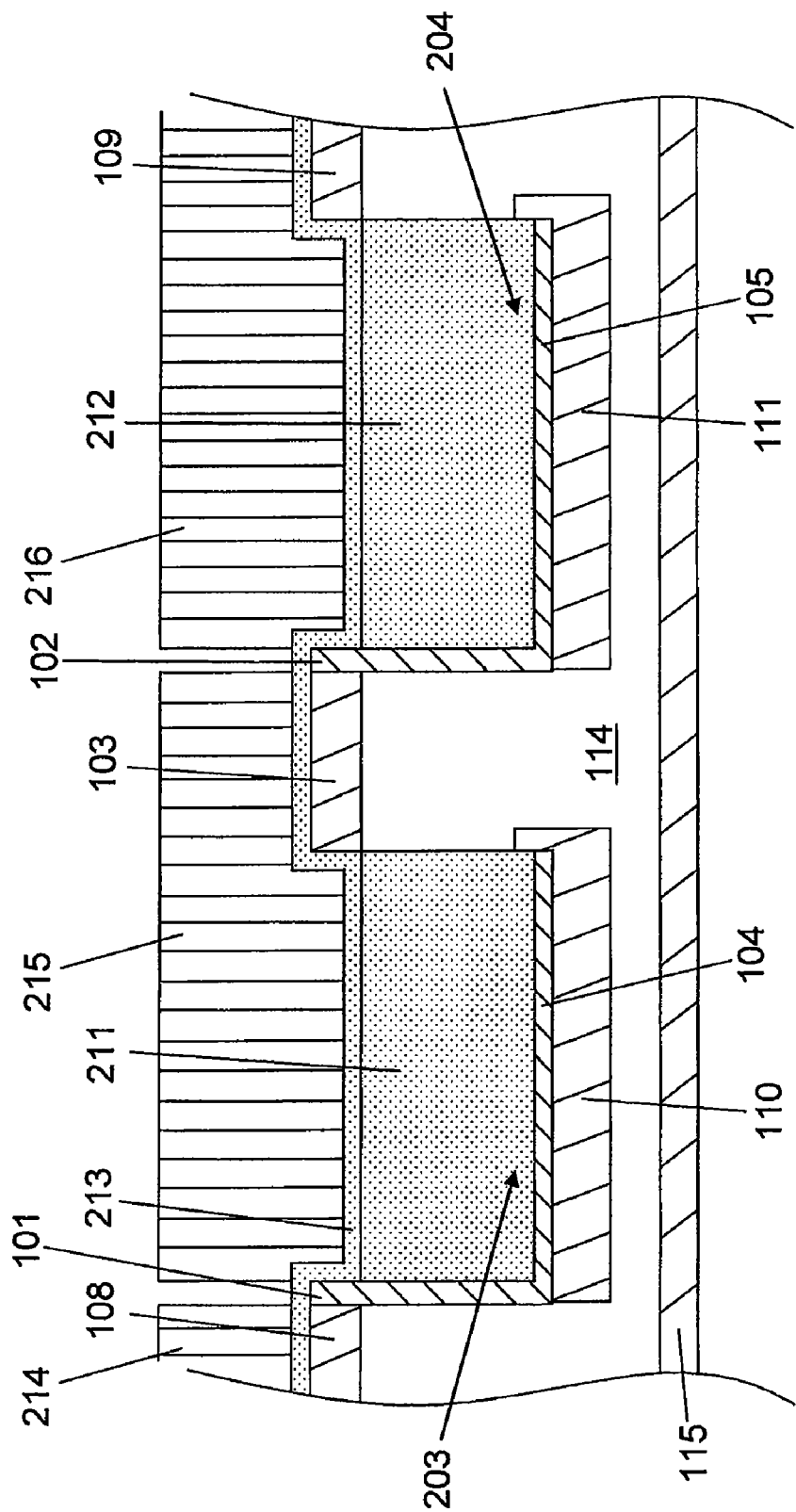
FIG. 17(a) is a sectional view ($X_1$-$X'_1$ section) showing a step of the example of the production process for the CCD solid-state image pickup element according to the embodiment.
Figure 17B:
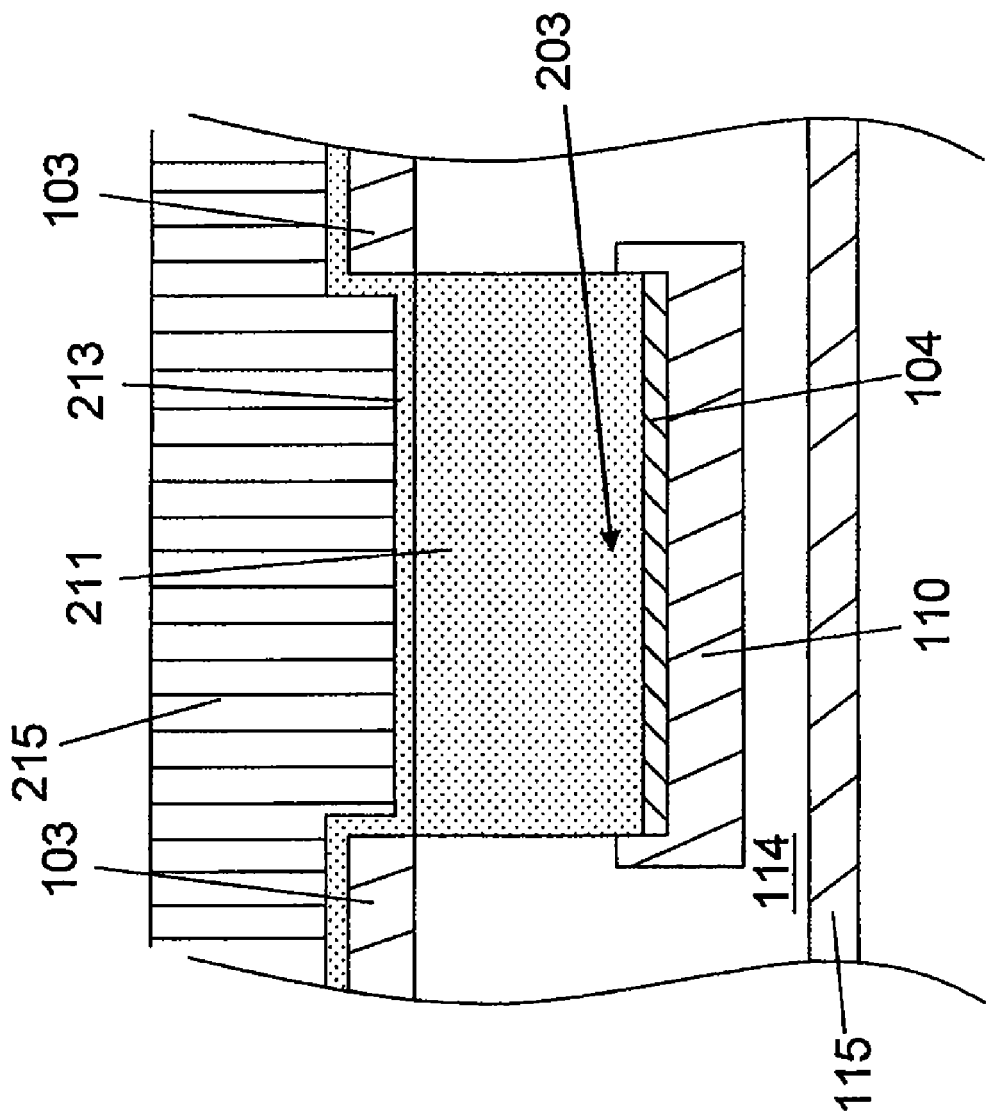
FIG. 17(b) is a sectional view ($Y_1$-$Y'_1$ section) showing the step in FIG. 17(a), in the example of the production process for the CCD solid-state image pickup element according to the embodiment.

A resist (214, 215, 216) is formed, and then boron is implanted to form a p+-type element isolation region (101, 102) (FIGS. 17(a) and 17(b)).

Figure 18A:
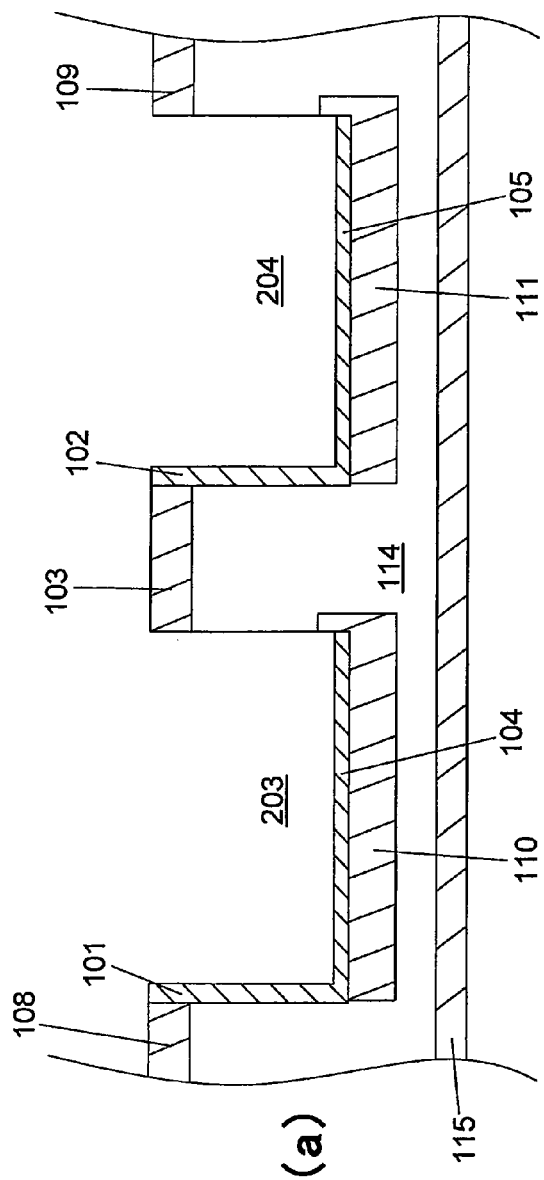
FIG. 18(a) is a sectional view ($X_1$-$X'_1$ section) showing a step of the example of the production process for the CCD solid-state image pickup element according to the embodiment.
Figure 18B:
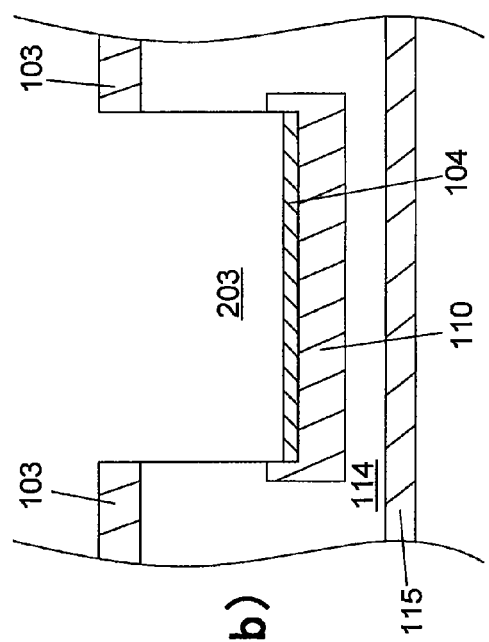
FIG. 18(b) is a sectional view ($Y_1$-$Y'_1$ section) showing the step in FIG. 18(a), in the example of the production process for the CCD solid-state image pickup element according to the embodiment.

The resist and the oxide film are removed (FIGS. 18(a) and 18(b)).

Figure 19A:
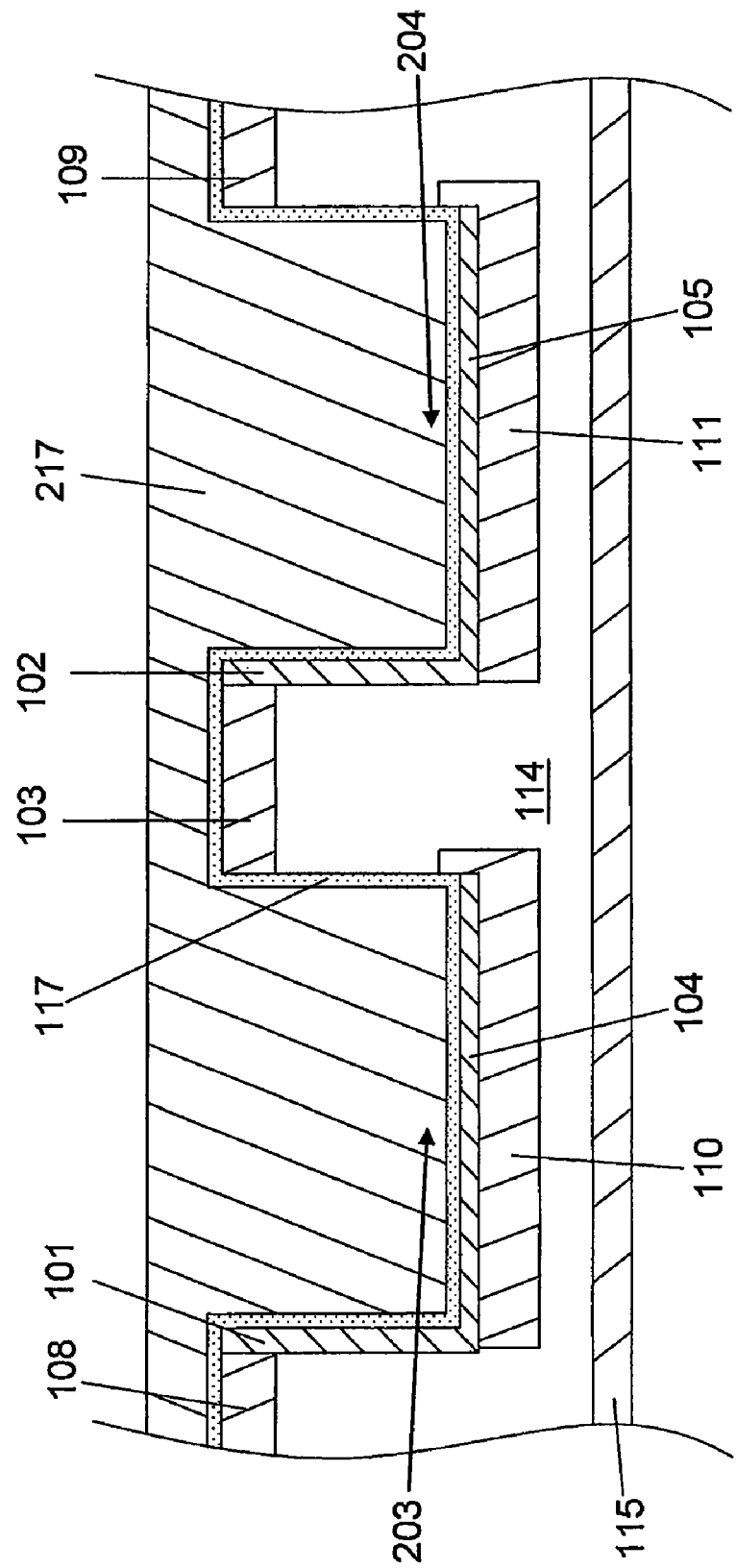
FIG. 19(a) is a sectional view ($X_1$-$X'_1$ section) showing a step of the example of the production process for the CCD solid-state image pickup element according to the embodiment.
Figure 19B:
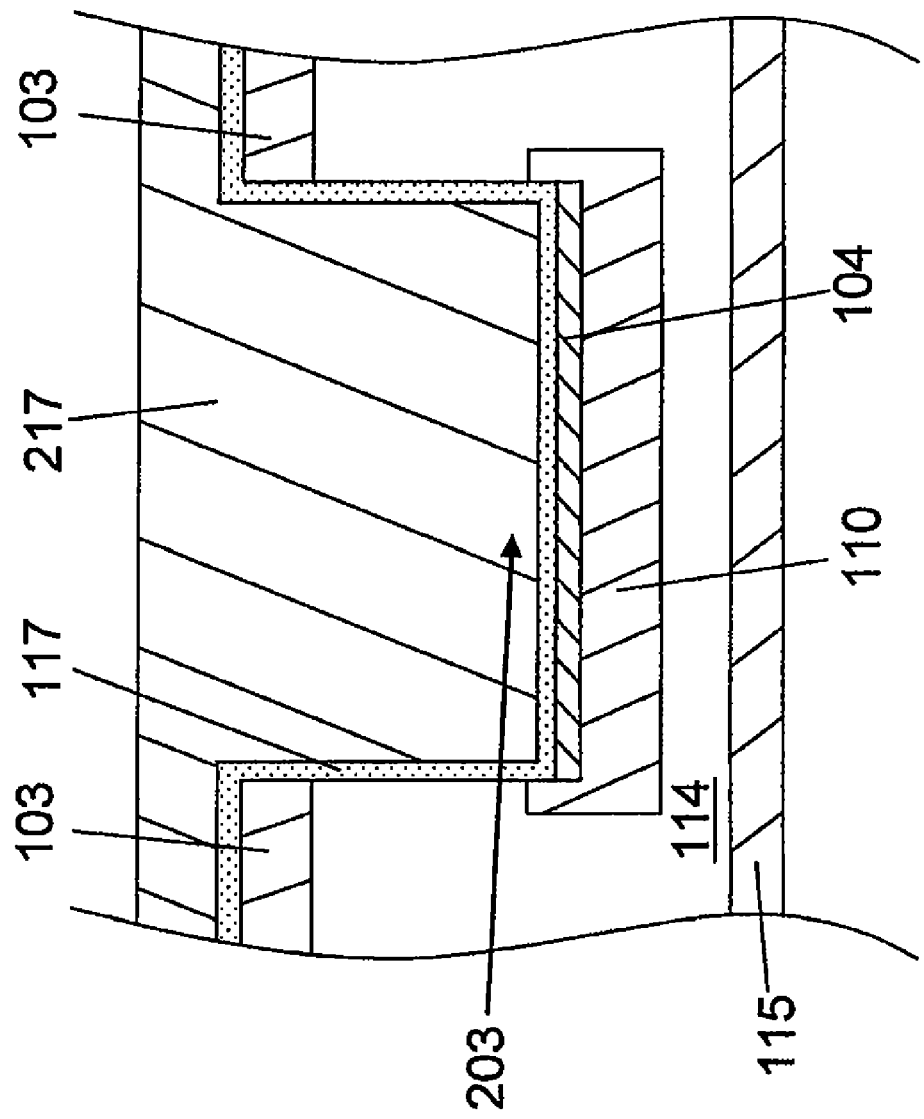
FIG. 19(b) is a sectional view ($Y_1$-$Y'_1$ section) showing the step in FIG. 19(a), in the example of the production process for the CCD solid-state image pickup element according to the embodiment.

A gate dielectric film 117 is formed, and then polysilicon is deposited and flattened (FIGS. 19(a) and 19(b)).

Figure 20A:
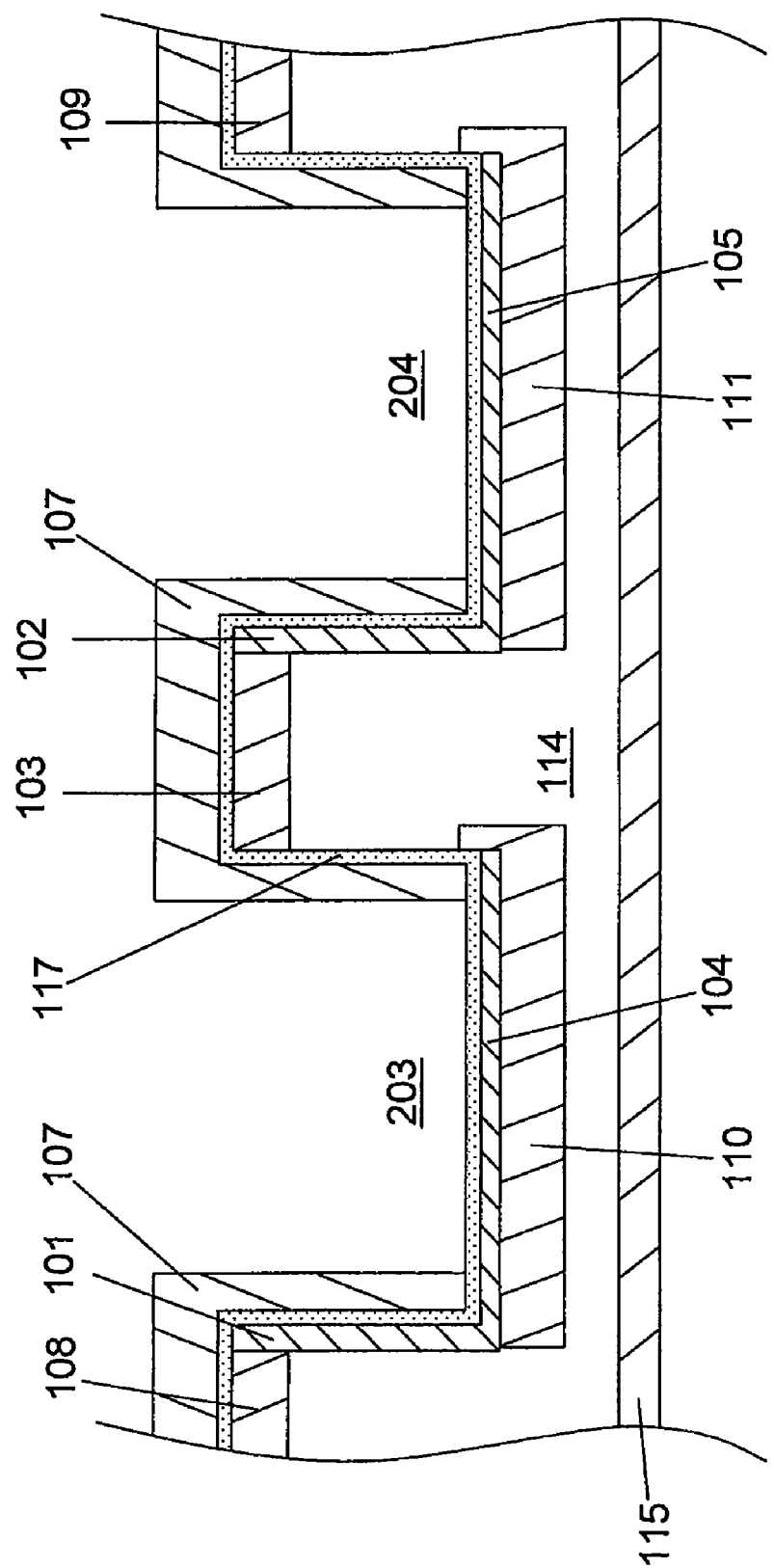
FIG. 20(a) is a sectional view ($X_1$-$X'_1$ section) showing a step of the example of the production process for the CCD solid-state image pickup element according to the embodiment.

The polysilicon is etched to form a transfer electrode (106, 107) (FIGS. 20(a) and 20(b)).

Figure 21A:
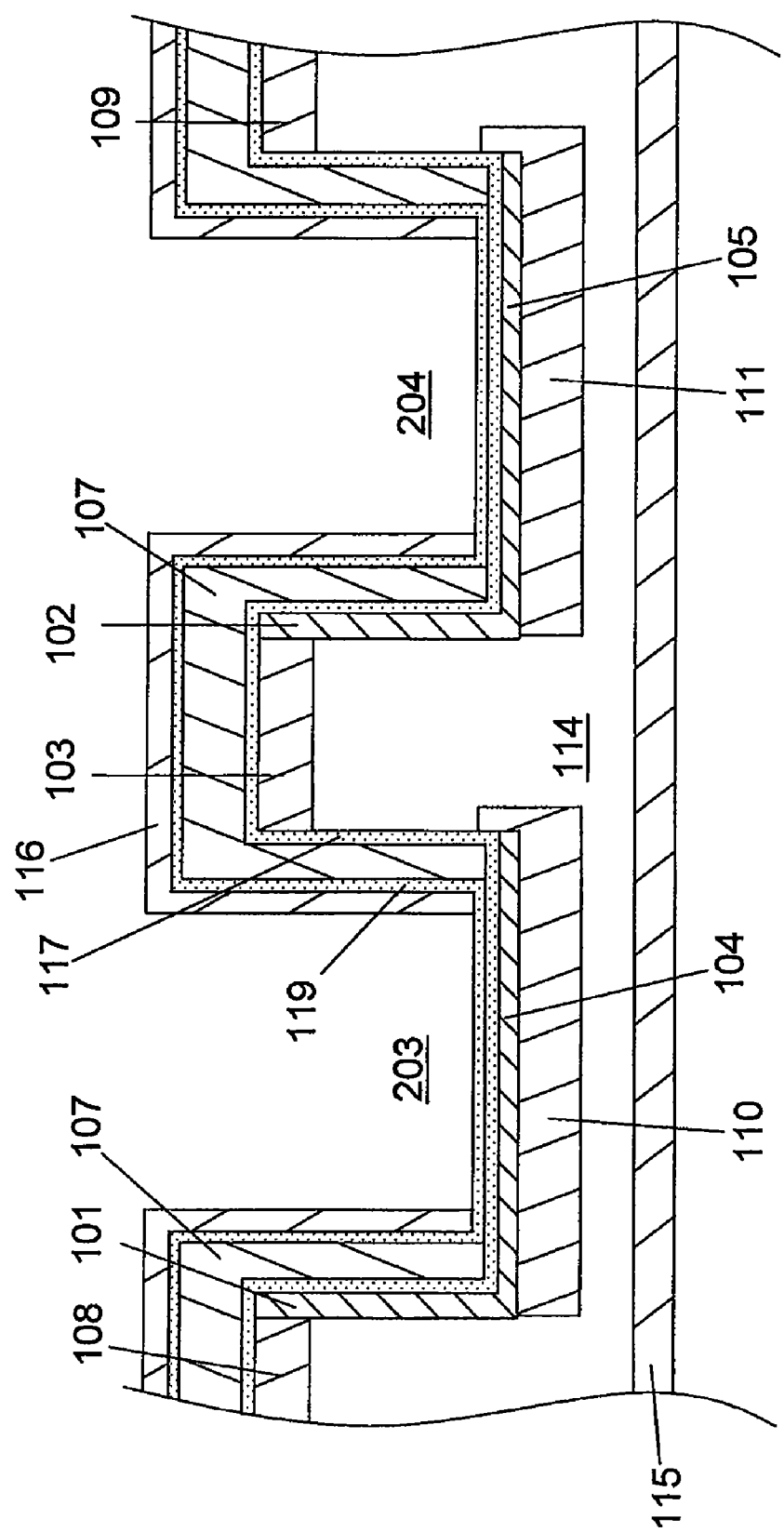
FIG. 21(a) is a sectional view ($X_1$-$X'_1$ section) showing a step of the example of the production process for the CCD solid-state image pickup element according to the embodiment.
Figure 21B:
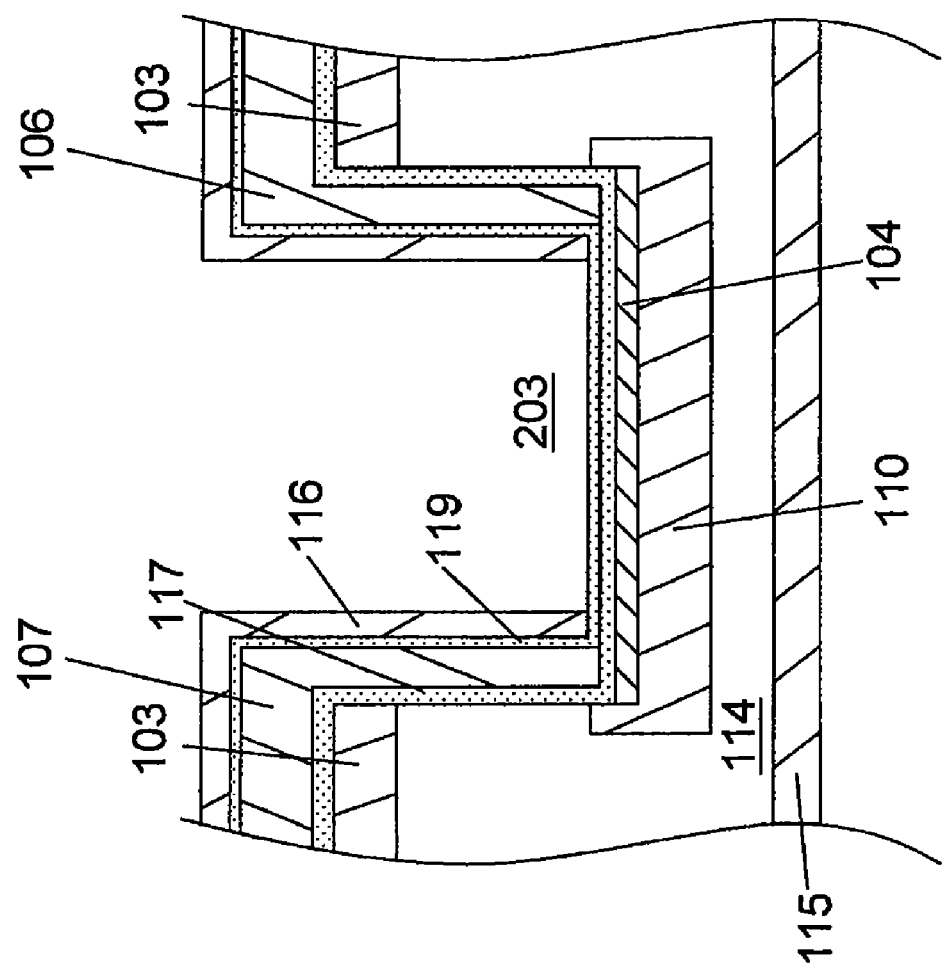
FIG. 21(b) is a sectional view ($Y_1$-$Y'_1$ section) showing the step in FIG. 21(a), in the example of the production process for the CCD solid-state image pickup element according to the embodiment.

A dielectric film 119 and a metal shield film 116 are deposited, and then the metal shield film 116 is etched (FIGS. 21(a) and 21(b)).

In the above example, the transfer electrode may be made of an electrode material commonly used in semiconductor processes or solid-state devices. For example, the electrode material includes low-resistance polysilicon, tungsten (W), molybdenum (Mo), tungsten silicide (WSi), molybdenum silicide (MoSi), titanium silicide (TiSi), tantalum silicide (TaSi) and copper silicide (CuSi). The transfer electrode may be formed in a multilayer structure using such a material without interposing a dielectric film therebetween.

For example, the metal shield film may be formed as a metal film made of one selected from the group consisting of aluminum (Al), chromium (Cr), tungsten (W), titanium (Ti), molybdenum (Mo), an alloy layer made of a combination of two or more thereof, or a multilayer metal film formed of a combination of two or more selected from the group consisting of one or more types of the metal films and one or more types of the alloy layers.

Although the present invention has been described in term of specific exemplary embodiments, it is apparent to those skilled in the art that various changes and modifications may be made therein without departing from the spirit and scope of the invention as set forth in appended claims.

What is claimed is:

1. A solid-state image pickup device comprising:
a plurality of element line groups each comprising a first solid-state image pickup element line and a second solid-state image pickup element line, wherein the first solid-state image pickup element line and the second solid-state image pickup element line comprise a plurality of the solid-state image pickup elements including:
a first-conductive type planar semiconductor layer;
a second-conductive type planar semiconductor layer;
wherein the first-conductive type planar semiconductor layer is formed on the second-conductive type planar semiconductor layer;
a hole formed in the first-conductive type planar semiconductor layer;
a first-conductive type high-concentration impurity region formed in a bottom wall of the hole of the first-conductive type planar semiconductor layer;
a first-conductive type high-concentration impurity-doped element isolation region formed in a sidewall of the hole of the first-conductive type planar semiconductor layer, and connected to the first-conductive type high-concentration impurity region;
a second-conductive type photoelectric conversion region formed in the first-conductive type planar semiconductor layer located beneath the first-conductive type high-concentration impurity region and in a lower region of the sidewall of the hole of the first-conductive type planar semiconductor layer, and adapted to change a charge amount upon receiving light, wherein the second-conductive type photoelectric conversion region has an impurity concentration less than $1 \times 10^{18}$ cm$^{-3}$;
a transfer electrode formed on the entire sidewall of the hole of the first-conductive type planar semiconductor layer through a gate dielectric film;
a second-conductive type CCD channel region formed in a top surface of the first-conductive type planar semiconductor layer and in an upper region of the sidewall of the hole of the first-conductive type planar semiconductor layer; and
a read channel formed in a region of the first-conductive type planar semiconductor layer sandwiched between the second-conductive type photoelectric conversion region and the second-conductive type CCD channel region;
wherein said solid-state image pickup elements in the first solid-state image pickup element line are arranged in a first direction at first-distance intervals, and the solid-state image pickup elements in the second solid-state image pickup element line are arranged in the first direction at the first distance intervals while being staggered with respect to the solid-state image pickup elements in the first solid-state image pickup element line, and wherein the first and second solid-state image pickup element lines in each of the element line groups are arranged in a second direction perpendicular to the first direction at second distance intervals, and the element line groups are arranged in the second direction at the second distance intervals with a place in the first direction between adjacent groups.

2. The solid-state image pickup device as defined in claim 1, which comprises:
a plurality of the second-conductive type CCD channel regions made of a plurality of second-conductive type impurity regions each extending in a column direction into at least a region between adjacent columns of the holes formed in the first-conductive type planar semiconductor layer, while passing through the respective holes in the adjacent columns; and
a plurality of the first-conductive type high-concentration impurity-doped element isolation regions arranged to prevent contact between adjacent second-conductive type CCD channel regions.

3. The solid-state image pickup device as defined in claim 2, which comprises a plurality of the transfer electrodes each formed to extend in a row direction into a region between adjacent rows of the holes formed in the first-conductive type planar semiconductor layer, while passing through the respective holes in the adjacent rows, wherein the transfer electrodes are arranged spaced-apart from each other by a given distance to allow signal charges generated in each of the solid-state image pickup elements to be transferred along a respective associated one of the second-conductive type CCD channel regions.

* * * * *